US012731636B2

(12) United States Patent
Nataraj

(10) Patent No.: US 12,731,636 B2
(45) **Date of Patent: *Sep. 8, 2026**

(54) RECONFIGURABLE COMPUTE MEMORY HAVING SELECTION LOGIC TO CONTROL COMPUTE OPERATIONS

(71) Applicant: NUMEM Inc., Sunnyvale, CA (US)

(72) Inventor: Bindiganavale S. Nataraj, Cupertino, CA (US)

(73) Assignee: NUMEM, INC., Sunnyvale, CA (US)

( * ) Notice: Subject to any disclaimer, the term of this patent is extended or adjusted under 35 U.S.C. 154(b) by 54 days.

This patent is subject to a terminal disclaimer.

(21) Appl. No.: 18/626,860

(22) Filed: Apr. 4, 2024

(65) Prior Publication Data

US 2024/0249769 A1 Jul. 25, 2024

Related U.S. Application Data

(63) Continuation-in-part of application No. 17/870,684, filed on Jul. 21, 2022, now Pat. No. 11,967,366, (Continued)

(51) Int. Cl.
*G11C 11/419* (2006.01)
*G06N 3/04* (2023.01)
(Continued)

(52) U.S. Cl.
CPC .............. *G11C 11/419* (2013.01); *G06N 3/04* (2013.01); *G06N 3/063* (2013.01); *G11C 11/418* (2013.01); *H03K 19/20* (2013.01); *H03K 19/21* (2013.01)

(58) Field of Classification Search
CPC ..... G11C 11/418; G11C 11/419; H03K 19/20; H03K 19/21; G06N 3/04; G06N 3/063
(Continued)

(56) References Cited

U.S. PATENT DOCUMENTS 6,992,947 B1 * 1/2006 Pan .................... H03K 19/1776 365/154
7,570,503 B1 * 8/2009 Maheshwari .......... G11C 15/04 365/49.1
(Continued)

OTHER PUBLICATIONS

NonFinal Office Action for U.S. Appl. No. 16/934,860, Dec. 8, 2021, 15 pages, USPTO.
(Continued)

*Primary Examiner* — Sung Il Cho
(74) *Attorney, Agent, or Firm* — Jaffery Watson Hamilton & DeSanctis LLP

(57) ABSTRACT

A memory includes an array with rows and columns of memory cells. The rows include a first row and a second row. The memory also includes a plurality of logic gates in the array. Each logic gate of the plurality of logic gates includes a first input coupled to a respective memory cell in the first row, a second input coupled to a respective memory cell in the second row, and an output. The memory further includes selection logic coupled to the plurality of logic gates. The selection logic includes a two dimensional (2D) associative array to generate select lines associated with a first pair of rows of memory cells. The select lines are configured to provide enable signals to the plurality of logic gates to control compute operations of the array.

19 Claims, 16 Drawing Sheets

Related U.S. Application Data which is a continuation of application No. 16/934,860, filed on Jul. 21, 2020, now Pat. No. 11,398,273.

(60) Provisional application No. 63/035,530, filed on Jun. 5, 2020.

(51) Int. Cl.

| | |
|---|---|
| ***G06N 3/063*** | (2023.01) |
| ***G11C 11/418*** | (2006.01) |
| ***H03K 19/20*** | (2006.01) |
| ***H03K 19/21*** | (2006.01) |

(58) Field of Classification Search

USPC .......................................................... 365/154

See application file for complete search history.

(56) References Cited

U.S. PATENT DOCUMENTS

| | | | | |
|---|---|---|---|---|
| 8,493,811 | B2 * | 7/2013 | Shiu | G11C 8/18 365/230.06 |
| 11,398,273 | B1 | 7/2022 | Nataraj | |
| 11,631,459 | B2 * | 4/2023 | Wickeraad | G11C 15/02 365/49.11 |
| 11,967,366 | B2 | 4/2024 | Nataraj | |
| 2004/0008564 | A1 * | 1/2004 | Tsuda | G11C 8/12 365/230.03 |
| 2011/0194370 | A1 * | 8/2011 | Shiu | G11C 8/18 365/230.06 |
| 2013/0322145 | A1 * | 12/2013 | Shin | G11C 15/00 365/49.1 |
| 2019/0228307 | A1 | 7/2019 | Lee et al. | |
| 2023/0085574 | A1 | 3/2023 | Nataraj | |

OTHER PUBLICATIONS

Final Office Action for U.S. Appl. No. 16/934,860, Feb. 11, 2022 15 pages, USPTO.

Notice of Allowance for U.S. Appl. No. 16/934,860, Aug. 23, 2022, 10 pages, USPTO.

Supplemental Notice of Allowance for U.S. Appl. No. 16/934,860, Apr. 11, 2022, 3 pages, USPTO.

NonFinal Office Action for U.S. Appl. No. 17/870,684, Apr. 13, 2023, 17 pages, USPTO.

Final Office Action for U.S. Appl. No. 17/870,684, Oct. 6, 2023, 16 pages, USPTO.

Notice of Allowance for U.S. Appl. No. 17/870,684, Dec. 19, 2023, 10 pages, USPTO.

Notice of Allowance and AFCP Decision for U.S. Appl. No. 17/870,684, mailing date Dec. 19, 2023, 10 pages, USPTO.

Final Office Action for U.S. Appl. No. 17/870,684, mailing date Oct. 6, 2023, 16 pages, USPTO.

Non-Final Office Action for U.S. Appl. No. 17/870,684, mailing date Apr. 13, 2023, 17 pages, USPTO.

Supplemental Notice of Allowance for U.S. Appl. No. 16/934,860, mailing date Apr. 11, 2022, 3 pages, USPTO.

Notice of Allowance for U.S. Appl. No. 16/934,860, mailing date Mar. 23, 2022, 10 pages, USPTO.

Final Office Action for U.S. Appl. No. 16/934,860, mailing date Feb. 11, 2022, 15 pages, USPTO.

Non-Final Office Action for U.S. Appl. No. 16/934,860, mailing date Dec. 8, 2021, 14 pages, USPTO.

* cited by examiner

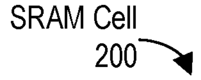
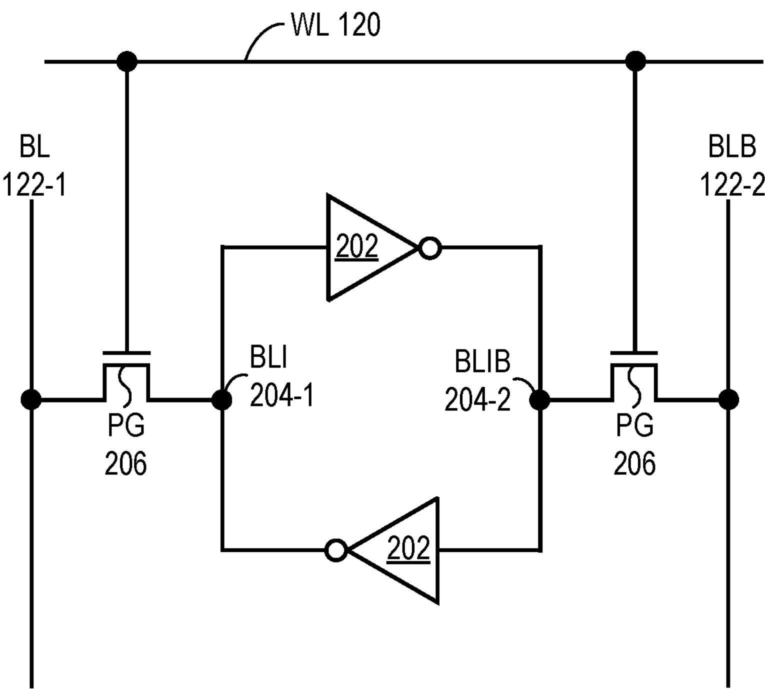
Figure 2

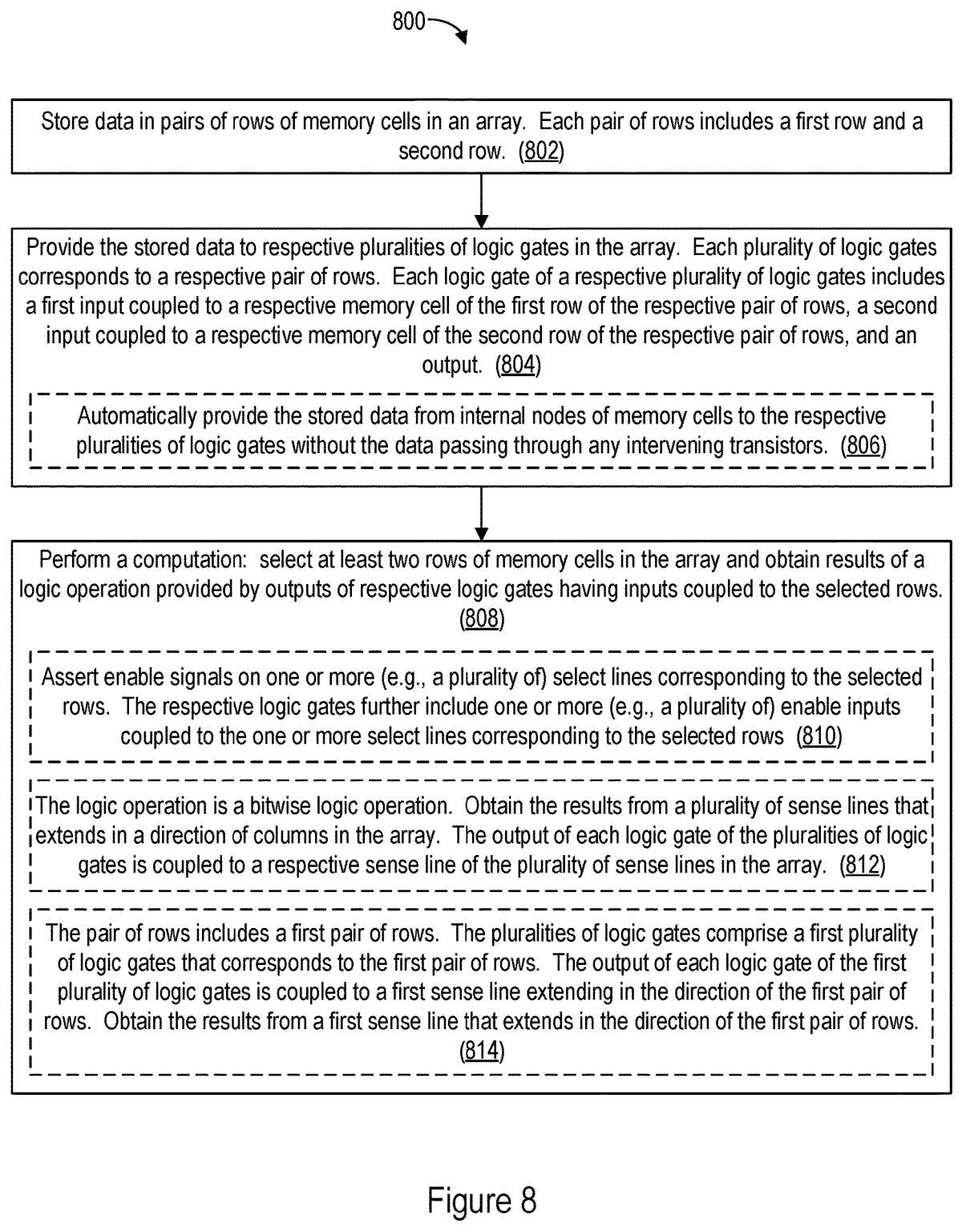

800

Store data in pairs of rows of memory cells in an array. Each pair of rows includes a first row and a second row. (802)

Provide the stored data to respective pluralities of logic gates in the array. Each plurality of logic gates corresponds to a respective pair of rows. Each logic gate of a respective plurality of logic gates includes a first input coupled to a respective memory cell of the first row of the respective pair of rows, a second input coupled to a respective memory cell of the second row of the respective pair of rows, and an output. (804)

Automatically provide the stored data from internal nodes of memory cells to the respective pluralities of logic gates without the data passing through any intervening transistors. (806)

Perform a computation: select at least two rows of memory cells in the array and obtain results of a logic operation provided by outputs of respective logic gates having inputs coupled to the selected rows. (808)

Assert enable signals on one or more (e.g., a plurality of) select lines corresponding to the selected rows. The respective logic gates further include one or more (e.g., a plurality of) enable inputs coupled to the one or more select lines corresponding to the selected rows (810)

The logic operation is a bitwise logic operation. Obtain the results from a plurality of sense lines that extends in a direction of columns in the array. The output of each logic gate of the pluralities of logic gates is coupled to a respective sense line of the plurality of sense lines in the array. (812)

The pair of rows includes a first pair of rows. The pluralities of logic gates comprise a first plurality of logic gates that corresponds to the first pair of rows. The output of each logic gate of the first plurality of logic gates is coupled to a first sense line extending in the direction of the first pair of rows. Obtain the results from a first sense line that extends in the direction of the first pair of rows. (814)

Figure 8

RECONFIGURABLE COMPUTE MEMORY HAVING SELECTION LOGIC TO CONTROL COMPUTE OPERATIONS

RELATED APPLICATIONS

This application is a continuation in part of U.S. patent application Ser. No. 17/870,684, filed Jul. 21, 2022, which is a continuation of U.S. patent application Ser. No. 16/934,860, filed Jul. 21, 2020, which claims the benefit of U.S. Provisional Application No. 63/035,530, filed Jun. 5, 2020, all of which are incorporated herein by reference in their entirety.

TECHNICAL FIELD

This disclosure relates to memory devices, and more specifically to memories with integrated logic gates for performing logical operations.

BACKGROUND

In traditional computer architectures, data to be used in calculations are stored in memory and read from the memory before the calculations are performed. The read time (i.e., the time taken to read the data from the memory) and the attendant power are key performance metrics, as is the compute time for subsequent calculations using the accessed data. The read time and compute time cause substantial delays in performing the calculations and thus are major limiting factors in computing performance. These issues are especially problematic for artificial-intelligence (AI) neural-network (NN) computations, which make extensive use of parallel general matrix multiplication (GEMM) operations with certain spatial and temporal cadence. GEMM operations include computations such as adding, multiplying, and other logical operations.

SUMMARY

According, there is a need for more efficient memory architectures that reduce the impact of read and compute time. For example, there is a need for memory architectures that allow GEMM operations to be performed efficiently using, for example, the structured organization of the memory.

In some embodiments, a memory includes an array with rows and columns of memory cells. The rows include a first row and a second row. The memory also includes a plurality of logic gates in the array. Each logic gate of the plurality of logic gates includes a first input coupled to a respective memory cell in the first row, a second input coupled to a respective memory cell in the second row, and an output. The memory further includes a plurality of sense lines in the array. The output of each logic gate of the plurality of logic gates is coupled to a sense line of the plurality of sense lines.

In some embodiments, a method includes storing data in pairs of rows of memory cells in an array. Each pair of rows includes a first row and a second row. The method also includes providing the stored data to respective pluralities of logic gates in the array. Each plurality of logic gates corresponds to a respective pair of rows. Each logic gate of a respective plurality of logic gates includes a first input coupled to a respective memory cell of the first row of the respective pair of rows, a second input coupled to a respective memory cell of the second row of the respective pair of rows, and an output. The method further includes performing a computation, which includes selecting at least two rows of memory cells in the array and obtaining results of a logic operation provided by respective logic gates having inputs coupled to the selected rows. The memory further includes selection logic coupled to the plurality of logic gates. The selection logic includes a two dimensional (2D) associative array to generate select lines associated with a first pair of rows of memory cells. The select lines are configured to provide enable signals to the plurality of logic gates to control compute operations of the array.

BRIEF DESCRIPTION OF THE DRAWINGS

For a better understanding of the various described implementations, reference should be made to the Detailed Description below, in conjunction with the following drawings.

FIG. 2 is a circuit diagram of an SRAM cell that is an example of a memory cell in FIG. 1.

FIG. 8 is a flowchart showing a method of computation in accordance with some embodiments.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
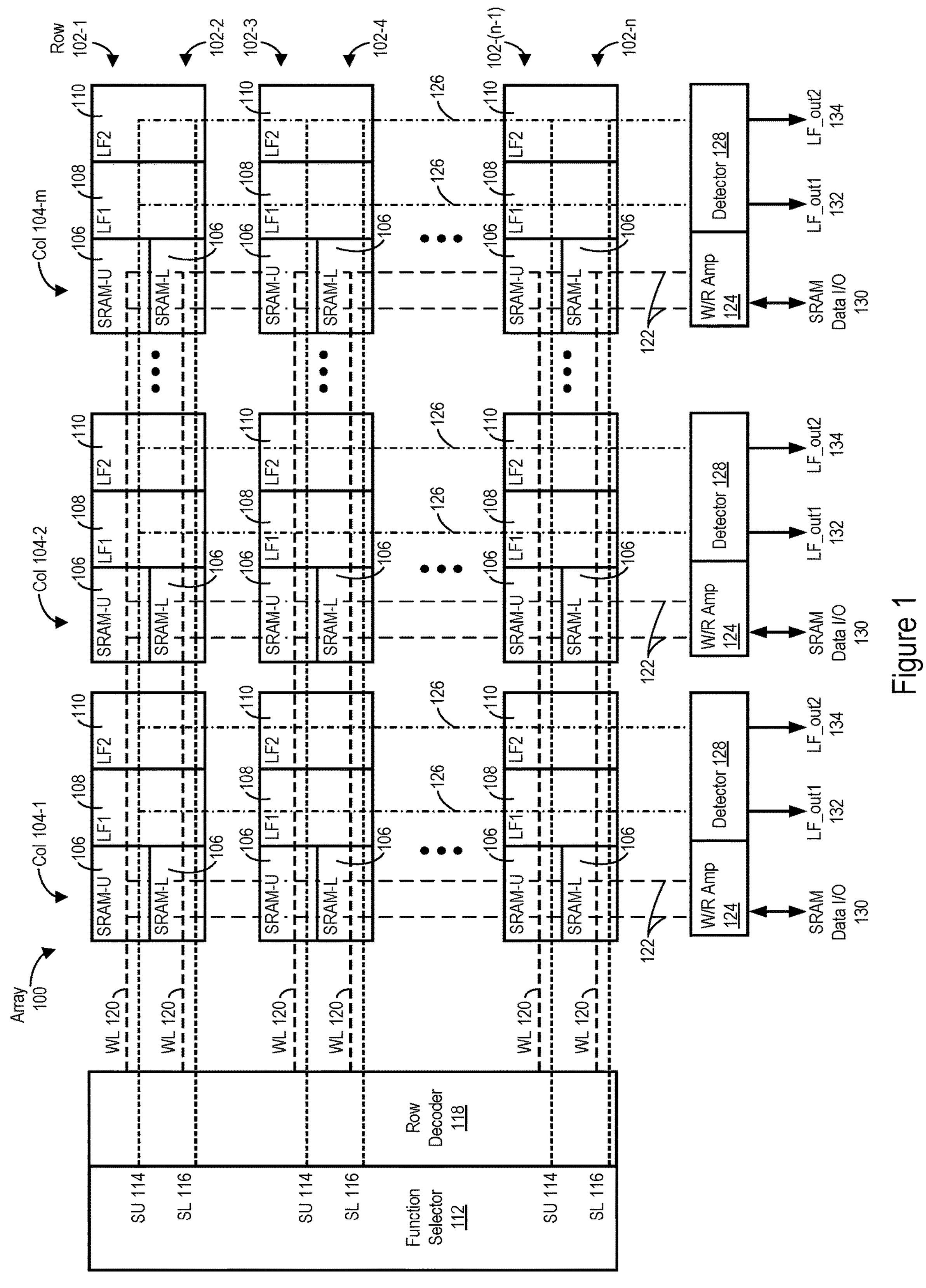
FIG. 1 is a schematic view of an array in a semiconductor memory in accordance with some embodiments.

FIG. 1 is a schematic view of an array 100 in a semiconductor memory in accordance with some embodiments. The array 100 includes rows 102-1 through **102-*n* and columns 104-1 through 104-*m* of memory cells 106, where integers n and m are the respective numbers of rows and columns. In some embodiments, the memory cells 106 are static random-access memory (SRAM cells), as shown in FIG. 1. Each memory cell 106 is connected to a wordline (WL) 120 and a pair of bitlines 122. The memory cells 106 in each row 102 are connected to a respective wordline 120, while the memory cells 106 in each column 104 are connected to a respective pair of bitlines 122. A row decoder 118 activates the memory cells 106 in a selected row 102 by asserting a signal on the wordline 120 of the selected row 102 (e.g., by biasing the wordline 120 of the selected row 102 to a logic-high state). Asserting the signal on the wordline 120 causes the memory cells 106 in the selected row 102 to become conductively coupled to their respective pairs of bitlines 122. When the signal on a wordline 120 is de-asserted (e.g., the wordline 120 is biased to a logic-low state), the memory cells 106 in the corresponding row 102 are not conductively coupled to their respective pairs of bitlines 122. The wordlines 120 may be one-hot, such that the row decoder 118 only asserts a signal on a single wordline 120 at a given time for a given operation (e.g., for a read or write operation). For write operations, SRAM data input/outputs (I/Os) 130 provide data to write/read (W/R) amplifiers 124, which drive the data onto the pairs of bitlines 122. The data itself are driven onto a first bitline of each pair of bitlines 122 and the complement data ("data-bar") are driven onto a second bitline 122 of each pair of bitlines 122. The data are written into the memory cells 106 of the selected row 102. For read operations, the memory cells 106 in the selected row 102 drive their respective pairs of bitlines 122. The signals on the pairs of bitlines 122 are amplified by the W/R amplifiers 124 and provided to the SRAM data I/Os 130** as output.

The array 100 also includes logic gates (i.e., compute elements) 108 and/or 110. The logic gates 108 and/or 110 implement logic functions using data from respective memory cells 106. For example, each logic gate 108 implements a first logic function (LF1) using data from a respective pair of memory cells 106 in a respective pair of rows 102, and each logic gate 110 implements a second logic function (LF2) using the data from the respective pair of memory cells 106 in the respective pair of rows 102. The respective pair of memory cells 106 may be situated in the same column 104. For example, the respective pair of memory cells 106 may include an upper SRAM cell (SRAM-U) and a lower SRAM cell (SRAM-L). Each logic gate 108 may be adjacent to a respective logic gate 110. In some embodiments, the logic gates 110 are omitted, such that the array only includes logic gates 108 that implement a first logic function. In some other embodiments, the array 100 includes additional logic gates that implement additional logic functions beyond the first and second logic functions (e.g., a third logic function, third and fourth logic functions, etc.) using the data from the respective pair of memory cells 106 in the respective pair of rows 102.

Each pair of rows 102 (e.g., rows 102-1 and 102-2, rows 102-3 and 102-4, etc.) includes a first row (e.g., an upper row, such as row 102-1, row 102-3, etc., or alternatively a lower row) and a second row (e.g., a lower row, such as row 102-2, row 102-4, etc., or alternatively an upper row). In some embodiments, the first and second rows in a respective pair of rows 102 (e.g., in each pair of rows 102) are adjacent to each other in the array 100 (i.e., the first row is adjacent to the second row). In some embodiments, a respective plurality of logic gates 108 and/or 110 is embedded in a respective pair of rows (i.e., is embedded in the first and second rows of the respective pair of rows 102) in the array 110. For example, a respective plurality of logic gates 108 and/or 110 may be embedded in each respective pair of rows 102 in the array 100. Logic gates 108 and/or 110 of the respective plurality of logic gates may be embedded in the first and second rows between successive memory cells 106 along the first and second rows. In the example of FIG. 1, a logic gate 108 and a logic gate 110 are embedded between successive memory cells 106 in the first and second rows of each pair of rows 102. Each logic gate 108 in a pair of rows 102 is adjacent to preceding memory cells 106 in the first and second rows of the pair of rows 102. Each logic gate 110 in a pair of rows 102 is adjacent to subsequent memory cells 106 in the first and second rows of the pair of rows 102 (except for the last logic gate 110 in each pair of rows 102).

Each logic gate 108 and/or 110 has a first input coupled to a respective memory cell 106 in the first row of a pair of rows 102 and a second input coupled to a respective memory cell 106 in the second row of the pair of rows 102. Again, the respective memory cells 106 may be situated in the same column 104. In some embodiments, respective logic gates 108 and/or 110 are adjacent to respective memory cells 106 in the first row to which first inputs of the respective logic gates 108 and/or 110 are coupled, and/or are adjacent to respective memory cells 106 in the second row to which second inputs of the respective logic gates 108 and/or 110 are coupled. For example, each adjacent pair of logic gates 108 and 110 embedded in a pair of rows 102 have first inputs coupled to a single adjacent (e.g., preceding or following) memory cell 106 in the first row and second inputs coupled to a single adjacent (e.g., preceding or following) memory cell 106 in the second row. In some embodiments, three or more logic gates, each of which may implement a separate logic function, are embedded between successive memory cells 106 in each pair of rows 102, with inputs coupled to a single respective (e.g., adjacent, such as preceding or following) memory cell 106 in the first row and to a single respective (e.g., adjacent, such as preceding or following) memory cell 106 in the second row.

The array 100 further includes one or more select lines 114 and/or 116 (e.g., a plurality of select lines 114 and 116) associated with each pair of rows 102, to provide enable signals to corresponding logic gates 108 and/or 110 (e.g., to the logic gates 108 and/or 110 embedded in the pair of rows 102). The select lines 114 and/or 116 extend in the direction of the rows 102. Each logic gate 108 and/or 110 includes one or more enable inputs (e.g., a plurality of enable inputs) coupled to one or more respective select lines 114 and/or 116. In some embodiments, the array 100 includes an upper select line (SU) 114 and a lower select line (SL) 116 for each pair of rows 102, to provide enable signals to the logic gates 108 and/or 110 embedded in the pair of rows 102. The upper select line 114 for a pair of rows 102 provides a first enable signal and the lower select line 116 for the pair of rows 102 provides a second enable signal. The upper select line 114 may extend along a first row of the pair of rows 102 and the lower select line 116 may extend along a second row of the pair of rows 102. Asserting enable signals on the one or more select lines 114 and/or 116 coupled to inputs of respective logic gates 108 and/or 110 (e.g., biasing the one or more select lines 114 and/or 116 to logic-high states) activates the respective logic gates 108 and/or 110, causing the logic gates 108 and/or 110 to implement their logic functions using data from respective memory cells 106 to which inputs of the logic gates 108 and/or 110 are coupled. De-asserting enable signals on the one or more select lines 114 and/or 116 coupled to inputs of respective logic gates 108 and/or 110 (e.g., biasing the one or more select lines 114 and/or 116 to logic-low states) de-activates the respective logic gates 108 and/or 110, thereby stopping the logic gates 108 and/or 110 from implementing their logic functions.

In some embodiments, the select lines 114 and/or 116 in the array 100 are not one-hot: enable signals on multiple select lines 114 and/or 116 may be asserted simultaneously. For example, enable signals on the upper select line 114 and lower select line 116 for a pair of rows 102 may be simultaneously asserted to activate the logic gates 108 and/or 110 in the pair of rows 102. Enable signals on upper select lines 114 and/or lower selection lines 116 for multiple pairs of rows 102 (e.g., two pairs of rows) may be simultaneously asserted to activate the logic gates 108 and/or 110, or portions therefore, in those pairs of rows 102.

The array 100 further includes a plurality of sense lines 126. Each logic gate 108 and/or 110 is coupled to a sense line of the plurality of sense lines 126. In the example of FIG. 1, the plurality of sense lines 126 include multiple sense lines 126 that extend in the direction of the columns 104. The outputs of the logic gates 108 for a respective column 104 are all coupled to a respective sense line 126 of the multiple sense lines, and the outputs of the logic gates 110 for a respective column 104 are all coupled to another respective sense line 126 of the multiple sense lines. The multiple sense lines 126 are coupled to detector circuitry 128, which senses the states of the sense lines 126 and thereby receives the results of logic functions implemented by the logic gates 108 and/or 110. (The sense lines 126 may also be referred to as detector lines.) The detector circuitry 128 provides the results of the first logic function implemented by the logic gates 108 as output signals LF_out1 132 and provides the results of the second logic function implemented by the logic gates 110 as output signals LF_out2 134.

FIG. 2 is a circuit diagram of an SRAM cell 200 that is an example of a memory cell 106 (FIG. 1). The SRAM cell 200 includes a pair of inverters 202 (e.g., complementary metal-oxide semiconductor (CMOS) inverters) coupled between internal nodes 204-1 (BLI) and 204-2 (BLIB). The voltage at the internal node 204-1 corresponds to the value of the data bit stored in the SRAM cell 200. The internal node 204-1 is thus the internal data node of the SRAM cell 200. The voltage at the internal node 204-2 corresponds to the complement of the value of the data bit stored in the SRAM cell 200. The internal node 204-2 is thus the internal data-bar node of the SRAM cell 200, where "data-bar" refers to the complement of the data. Pass gates 206 selectively conductively couple the internal data and data-bar nodes 204-1 and 204-2 to respective bitlines 122-1 (BL or "bitline") and 122-2 (BLB or "bitline-bar"). The pass gates 206 may be field-effect transistors (e.g., n-type metal-oxide-semiconductor field-effect transistors (MOSFETs)) with gate terminals connected to a wordline 120. When a signal is asserted on the wordline 120, the pass gates 206 turn on and conductively couple the internal data and data-bar nodes 204-1 and 204-2 to the respective bitlines 122-1 and 122-2. The data and data-bar nodes 204-1 and 204-2 are considered internal nodes because they are internal to the SRAM cell 200, behind the pass gates 206.

Figure 3:
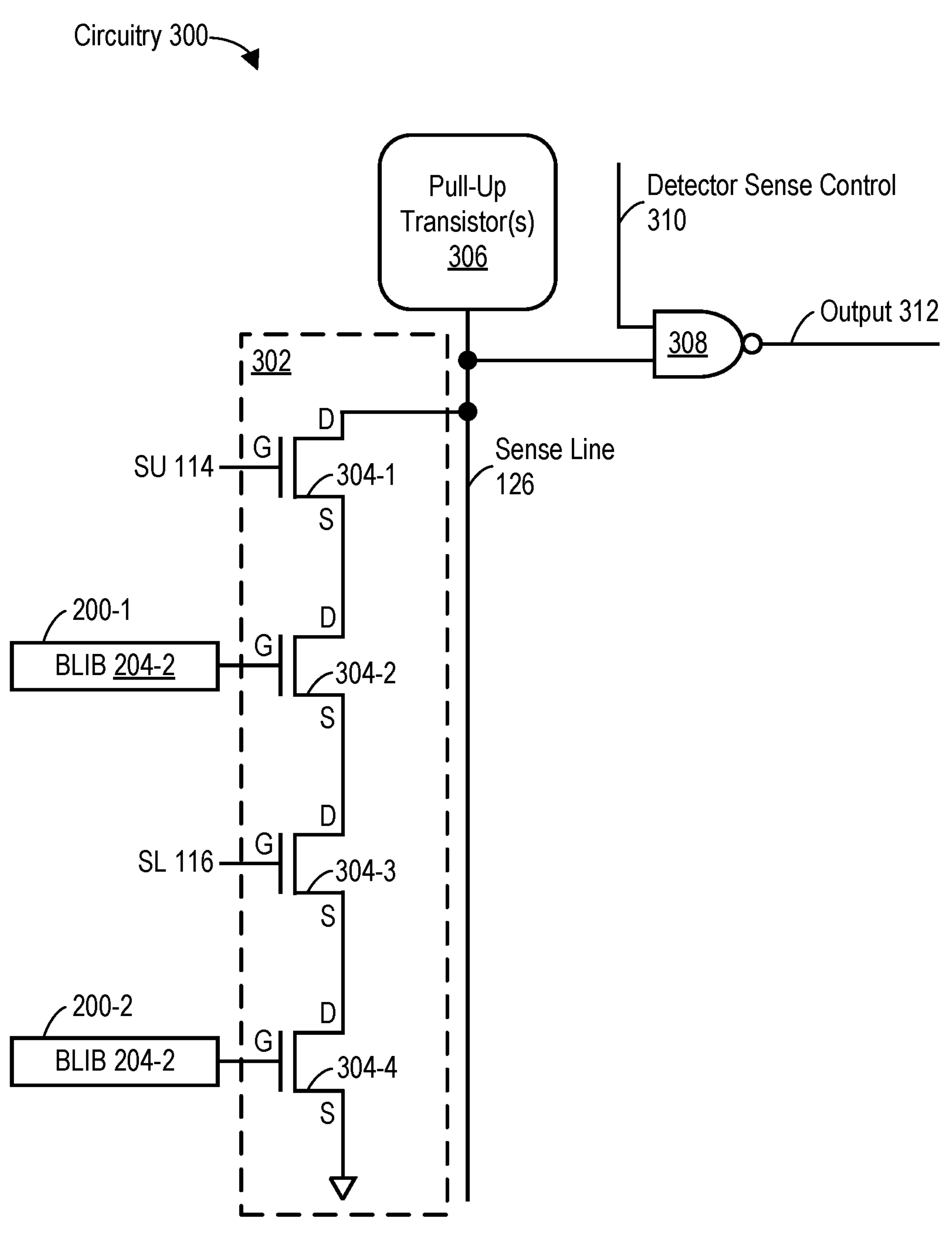
FIG. 3 is a circuit diagram of circuitry including a NAND gate coupled to two SRAM cells, in accordance with some embodiments.

FIG. 3 is a circuit diagram of circuitry 300 including a logic gate 302 coupled to two SRAM cells 200-1 and 200-2, which are examples of SRAM cells 200 (FIG. 2), in accordance with some embodiments. The logic gate 302 is an example of a logic gate 108 or 110 (FIG. 1). The logic gate 302 is a NAND gate with four transistors (e.g., n-type MOSFETs) 304-1, 304-2, 304-3, and 304-4. In some embodiments, the NAND gate 302 is connected between a sense line 126 and ground, with the transistors 304-1, 304-2, 304-3, and 304-4 arranged in series between the sense line 126 and ground. Each logic gate 108 (FIG. 1), or each logic gate 110, may be a NAND gate 302 connected between a sense line 126 and ground. While the four transistors 304-1, 304-2, 304-3, and 304-4 are shown in a particular order, this order may vary.

The gate terminals of the transistors 304-2 and 304-4 are first and second inputs of the NAND gate 302. The gate terminal of the transistor 304-2 (i.e., the first input of the NAND gate 302) is connected directly to the internal data-bar node 204-2 (FIG. 2) (or alternatively, to the internal data node 204-1) of the first SRAM cell 200-1, without an intervening transistor (e.g., without an intervening pass gate 206, FIG. 2, or any other transistor). Similarly, the gate terminal of the transistor 304-4 (i.e., the second input of the NAND gate 302) is connected directly to the internal data-bar node 204-2 (FIG. 2) (or alternatively, the internal data node 204-1) of the second SRAM cell 200-2, without an intervening transistor (e.g., without an intervening pass gate 206, FIG. 2, or any other transistor). The first SRAM cell 200-1 may be in the first row of a pair of rows 102 and the second SRAM cell 200-2 may be in the second row of the pair of rows 102. The first SRAM cell 200-1 and the second SRAM cell 200-2 may be in the same column 104.

The gate terminals of the transistors 304-1 and 304-3 are enable inputs of the NAND gate 302. The gate terminal of the transistor 304-1 (i.e., a first enable input of the NAND gate 302) is connected to an upper select line 114. The gate terminal of the transistor 304-3 (i.e., a second enable input of the NAND gate 302) is connected to a lower select line 116. The upper select line 114 and the lower select line 116 may be the select lines for a pair of rows 102 in which the first and second SRAM cells 200-1 and 200-2 are situated and in which the NAND gate 302 is embedded. Asserting enable signals on the upper select line 114 and the lower select line 116 (e.g., biasing the upper and lower select lines 114 and 116 to logic-high states) turns on the transistors 304-1 and 304-3. With the transistors 304-1 and 304-3 turned on, the NAND gate 302 performs a NAND operation for the values received from the SRAM cells 200-1 and 200-2 (i.e., the values provided to the gate terminals of the transistors 304-2 and 304-4). In some embodiments, one of the transistors 304-1 or 304-3 is omitted, such that the NAND gate 302 has a single enable input that receives a single enable signal from a single select line.

The NAND gate 302 provides its output to the sense line 126. If all four transistors 304-1 through 304-4 are turned on (e.g., the first input, second input, and enable inputs are all logic-high), then the NAND gate 302 pulls down the sense line 126; otherwise, the NAND gate 302 does not pull down the sense line 126. One or more pull-up transistors 306 are coupled to the sense line 126 to pull up the sense line 126 to a specified voltage (e.g., to a power supply voltage Vdd). The one-or-more pull-up transistors 306 may include a statically-biased pull-up transistor and/or a dynamically-biased pull-up transistor. The sense line 126 thus may be in a logic-high state unless the NAND gate 302 pulls it down toward ground (e.g., to a logic-low state).

The circuitry 300 further includes a detector 308 with a first input coupled to the sense line 126, a second input to receive a detector sense-control signal 310, and an output 312. In some embodiments, the value of the signal provided by the output 312 is the complement of the value on the sense line 126: the output 312 provides the result of an AND operation for the values that the NAND gate 302 receives from the SRAM cells 200-1 and 200-2. The signal provided by the output 312 is an example of an output signal LF_out1 132 or LF_out2 134 (FIG. 1). The detector circuitry 128 (FIG. 1) may include an instance of the detector 308 for each sense line 126.

Figure 4:
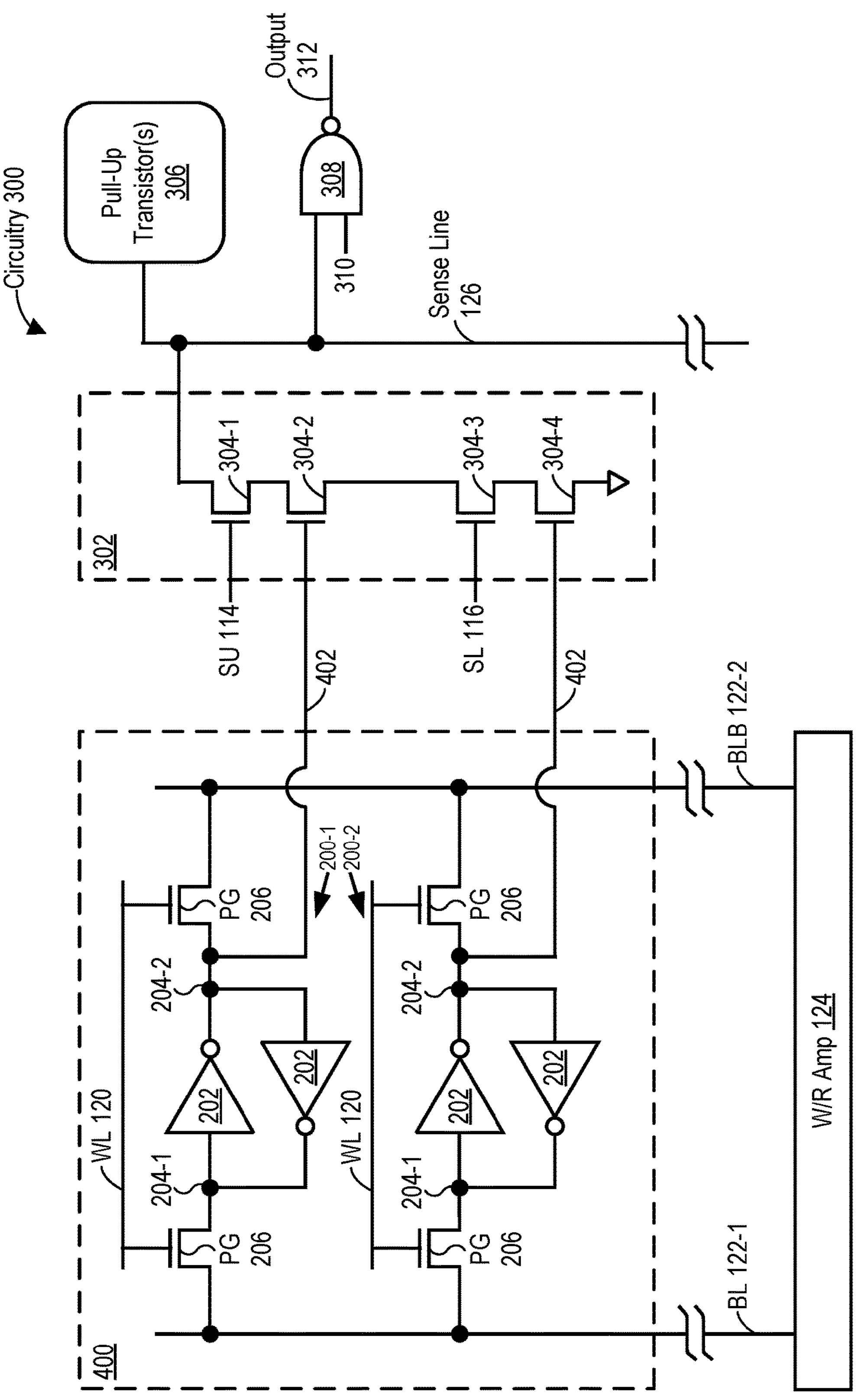
FIG. 4 is a circuit diagram showing the connections between a pair of SRAM cells and the NAND gate of FIG. 3, in accordance with some embodiments.

FIG. 4 is a circuit diagram showing the connections 402 between a pair 400 of SRAM cells 200-1 and 200-2 and the circuitry 300 (FIG. 3), in accordance with some embodiments. The connections 402 directly connect internal data-bar nodes 204-2 (or alternatively, internal data nodes 204-1) of the SRAM cells 200-1 and 200-2 to the gate terminals of the transistors 304-2 and 304-4, and thus to the first and second inputs of the NAND gate 302. The connections 402 may include conductive (e.g., metal) contacts, lines, and/or vias.

Figure 5:
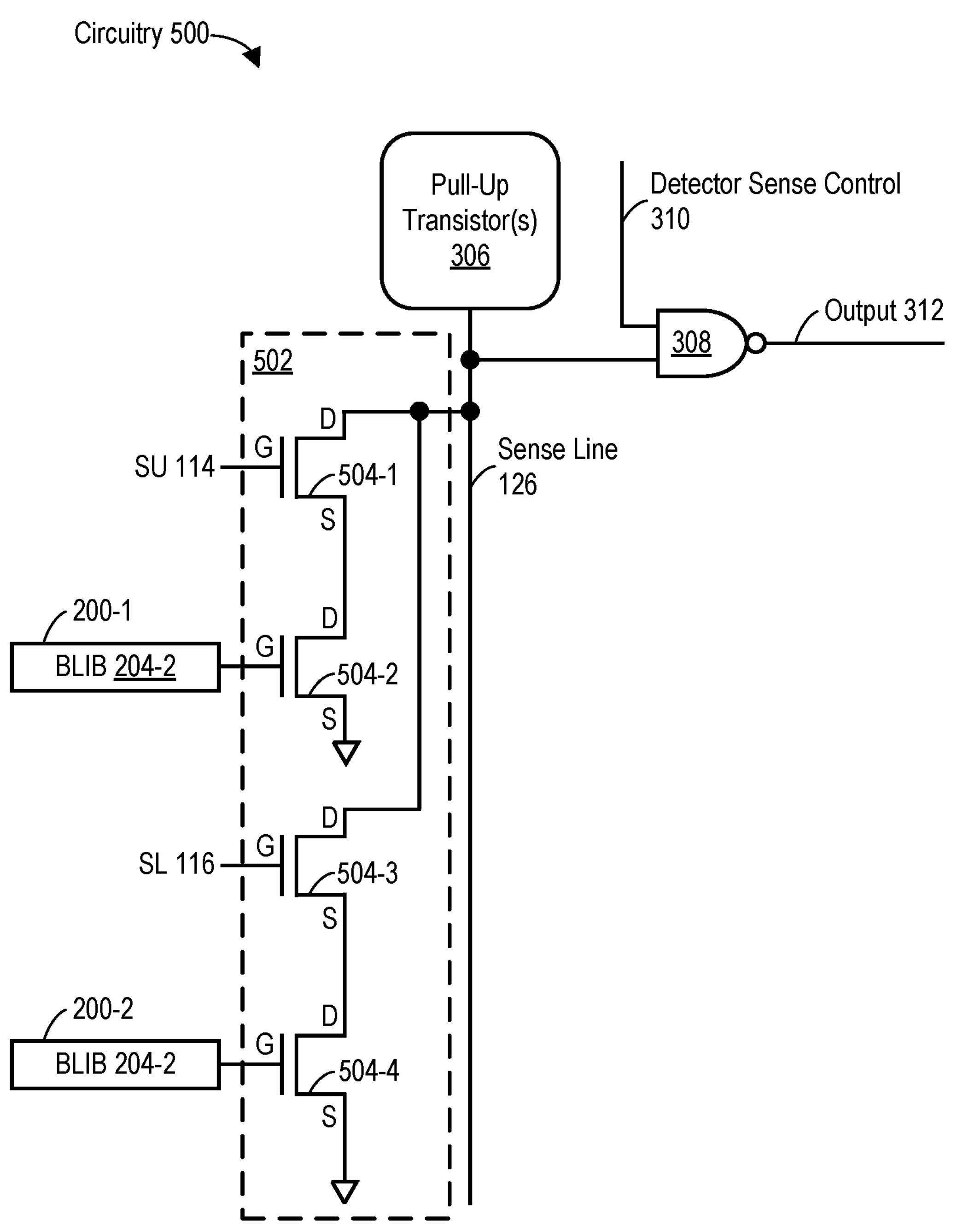
FIG. 5 is a circuit diagram of circuitry including a NOR gate coupled to two SRAM cells, in accordance with some embodiments.

FIG. 5 is a circuit diagram of circuitry 500 that includes the components of the circuitry 300 (FIG. 3), with the NAND gate 302 (FIG. 3) being replaced by a NOR gate 502, in accordance with some embodiments. The NOR gate 502 is an example of a logic gate 108 or 110 (FIG. 1). In some embodiments, the NOR gate 502 is connected between a sense line 126 and ground, and includes four transistors (e.g., n-type MOSFETs) 504-1, 504-2, 504-3, and 504-4 arranged between the sense line 126 and ground. The transistor 504-1 is arranged in series with the transistor 504-2, and the transistor 504-3 is arranged in series with the transistor 504-4. The series arrangement of the transistors 504-1 and 504-2 is in parallel with the series arrangement of the transistors 504-3 and 504-4. The order of the transistors 504-1 and 504-2 in their series arrangement may be reversed, as may the order of the transistors 504-3 and 504-4 in their series arrangement.

The gate terminals of the transistors 504-2 and 504-4 are first and second inputs of the NOR gate 502 and are connected directly to the internal data-bar nodes 204-2 (FIG. 2) (or alternatively, the internal data nodes 204-1) of respective first and second SRAM cells 200-1 and 200-2, in the same manner as the transistors 304-2 and 304-4 of the NAND gate 302 (FIG. 3). The gate terminals of the transistors 504-1 and 504-3 are enable inputs of the NOR gate 502 and are respectively connected to an upper select line 114 and a lower select line 116, in the same manner as the transistors 304-1 and 304-1 of the NAND gate 302 (FIG. 3). With the transistors 504-1 and 504-3 turned on, the NOR gate 502 performs a NOR operation for the data values received from the SRAM cells 200-1 and 200-2.

In some embodiments, the transistors 504-1 and 504-3 are replaced with a single transistor in series with a parallel arrangement of the transistors 504-2 and 504-4, such that the NOR gate 502 has a single enable input (i.e., the gate of the single transistor) that receives a single enable signal from a single select line.

The NOR gate 502 provides its output to a sense line 126. A detector 308 senses the value on the sense line 126 and provides a signal on the output 312. In some embodiments, the value of the signal provided by the output 312 is the complement of the value on the sense line 126: the output 312 provides the result of an OR operation for the data values that the NOR gate 502 receives from the SRAM cells 200-1 and 200-2.

Figure 6:
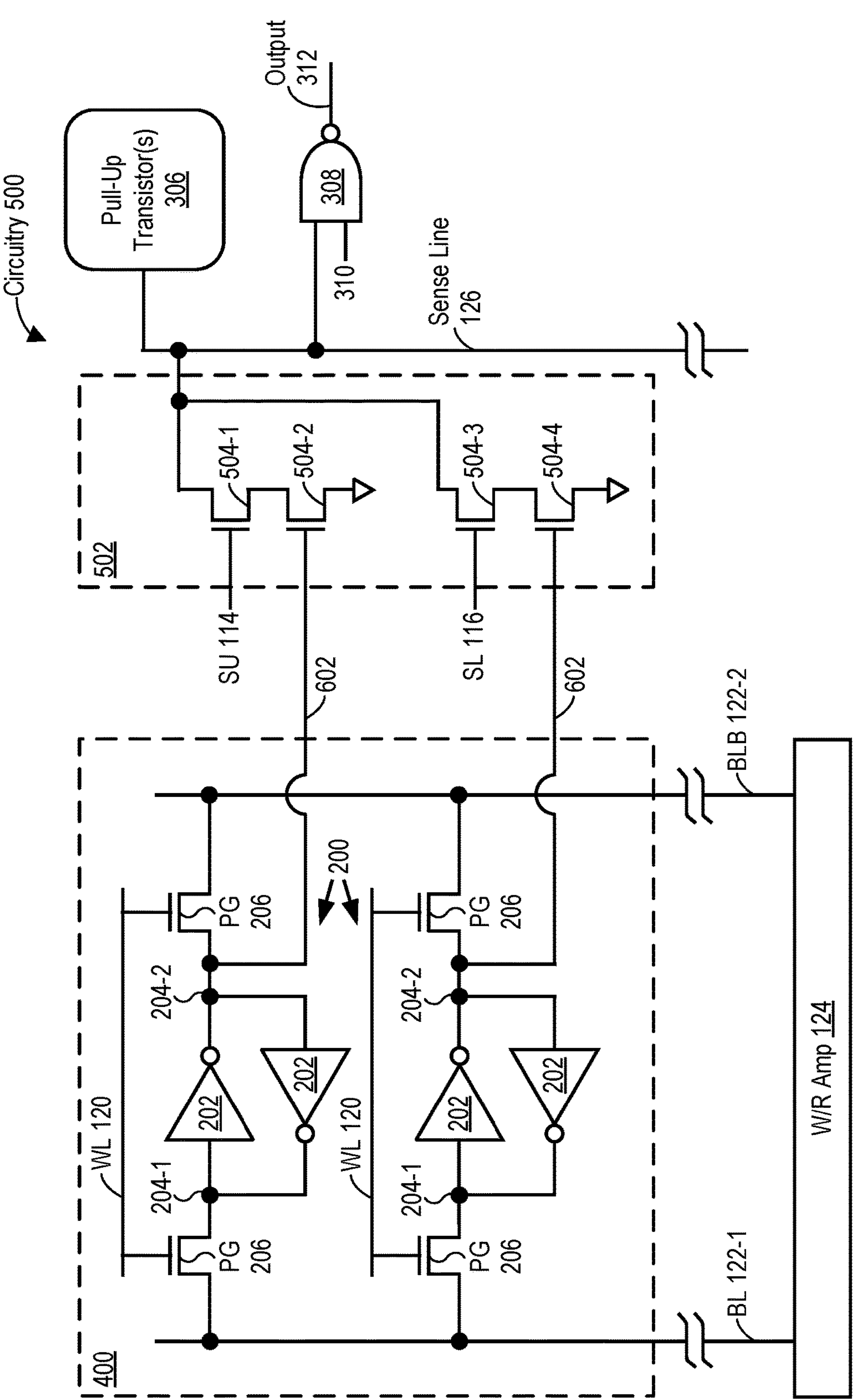
FIG. 6 is a circuit diagram showing the connections between a pair of SRAM cells and the NOR gate of FIG. 5 in accordance with some embodiments.

FIG. 6 is a circuit diagram showing the connections 602 between a pair 400 of SRAM cells 200-1 and 200-2 and the circuitry 500 (FIG. 5), in accordance with some embodiments. The connections 602 directly connect internal data-bar nodes 204-2 (or alternatively, internal data nodes 204-1) of the SRAM cells 200-1 and 200-2 to the gate terminals of the transistors 504-2 and 504-4, and thus to the first and second inputs of the NOR gate 502. The connections 602 may include conductive (e.g., metal) contacts, lines, and/or vias.

In some embodiments, the logic gates 108 (FIG. 1) are NAND gates 302 and the logic gates 110 (FIG. 1) are NOR gates 502, or vice-versa. Multiple NAND gates 302 for different pairs of rows 102 but the same column 104 may be connected to the same sense line 126, in a wired-OR configuration. Similarly, multiple NOR gates 502 for different pairs of rows 102 but the same column 104 may be connected to the same sense line 126, in a wired-OR configuration.

Figure 7:
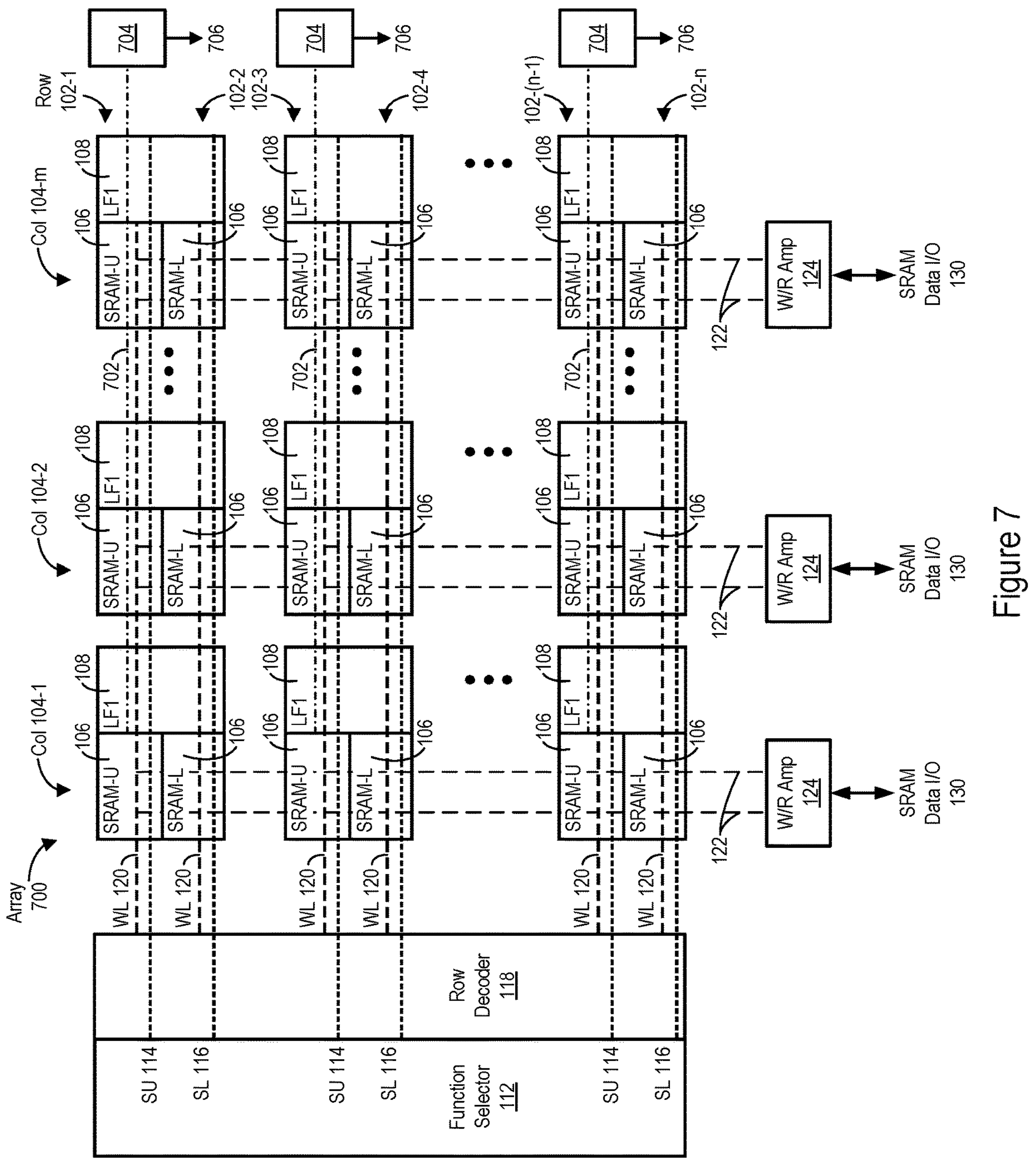
FIG. 7 is a schematic view of an array in a semiconductor memory, with sense lines that extend in the row direction in accordance with some embodiments.

FIG. 7 is a schematic view of an array 700 in a semiconductor memory in accordance with some embodiments. The array 700 includes rows 102 and columns 104 of memory cells arranged as in the array 100 (FIG. 1), along with logic gates 108 arranged as in the array 100. A plurality of sense lines 702 extends in the direction of the rows 102. The logic gates 108 in a respective pair of rows 102 are coupled through their outputs to a respective sense line 702 of the plurality of sense lines 702. For example, a first sense line 702 extends along the first and second rows 102-1 and 102-2, in the direction of the first and second rows 102-1 and 102-2, and couples to the outputs of the logic gates 108 in the first and second rows 102-1 and 102-2. The plurality of sense lines 702 are coupled to detector circuitry 704, which senses the states of the sense lines 702 and provides the results of the logic function implemented by the logic gates 108 as output signals 706. The detector circuitry 704 may include detectors 308 (FIG. 3 or 5). In some embodiments, the logic gates 108 in the array 700 are NAND gates. The output signals 706 may be useful for zero-detection.

The logic gates 110 (FIG. 1) may be omitted from the array 700. In some embodiments, an array may have both sense lines 702 (FIG. 7) and sense lines 126 (FIG. 1). In some embodiments, an array may have logic gates 108 and 110 (FIG. 1), with the logic gates 108 coupled to sense lines 126 and/or 702 and the logic gates 110 coupled to the sense lines 126 but not the sense lines 702. The logic gates 108 in such arrays may be configured to be selectively conductively coupled to only one of a corresponding sense line 702 or a corresponding sense lien 126 at a given time (e.g., through respective output transistors).

FIG. 8 is a flowchart showing a method 800 of computation in accordance with some embodiments. In the method 800, data are stored (802) in pairs of rows of memory cells in an array (e.g., rows 102 of memory cells 106 in the array 100 or 700, FIG. 1 or 7). Each pair of rows includes a first row and a second row.

The stored data are provided (804) to respective pluralities of logic gates (e.g., logic gates 108 and/or 110, FIG. 1 or 7; NAND gate 302, FIGS. 3-4; NOR gate 502, FIGS. 5-6) in the array. Each plurality of logic gates corresponds to a respective pair of rows. Each logic gate of a respective plurality of logic gates includes a first input coupled to a respective memory cell of the first row of the respective pair of rows, a second input coupled to a respective memory cell of the second row of the respective pair of rows, and an output. In some embodiments, the stored data are automatically provided (806) from internal nodes of memory cells to the respective pluralities of logic gates without the data passing through any intervening transistors. Automatically providing the stored data occurs without executing a command or instruction for providing the data.

A computation is performed (808). Performing the computation includes selecting at least two rows of memory cells in the array and obtaining results of a logic operation provided by outputs of respective logic gates (e.g., logic gates 108 or 110, FIG. 1; NAND gates 302, FIGS. 3-4; NOR gates 502, FIGS. 5-6) having inputs coupled to the selected rows. In some embodiments, enable signals are asserted (810) on one or more select lines (e.g., one or more upper select lines 114 and/or lower select lines 116, FIGS. 1 and 3-7) corresponding to the selected rows. The respective logic gates further include one or more enable inputs coupled to the one or more select lines corresponding to the selected rows. For example, enable signals are asserted on a plurality of select lines corresponding to the selected rows, wherein each select line of the plurality of select lines corresponds to a respective row of the selected rows, and the respective logic gates further include a plurality of enable inputs coupled to the plurality of select lines corresponding to the selected rows.

In some embodiments, the logic operation is a bitwise logic operation. The results are obtained (812) from a plurality of sense lines (e.g., sense lines 126, FIGS. 1 and 3-6) that extends in a direction of columns in the array. The output of each logic gate of the pluralities of logic gates is coupled to a respective sense line of the plurality of sense lines in the array.

In some embodiments of the method 800, first data are stored in the first row of a pair of rows and second data are stored in the second row of the pair of rows. The first and second rows of the pair of rows are selected. The respective logic gates that provide the results include NAND gates (e.g., NAND gates 302, FIGS. 3-4). The computation may be a bitwise AND calculation for the first data and the second data.

Figures 9, 10:
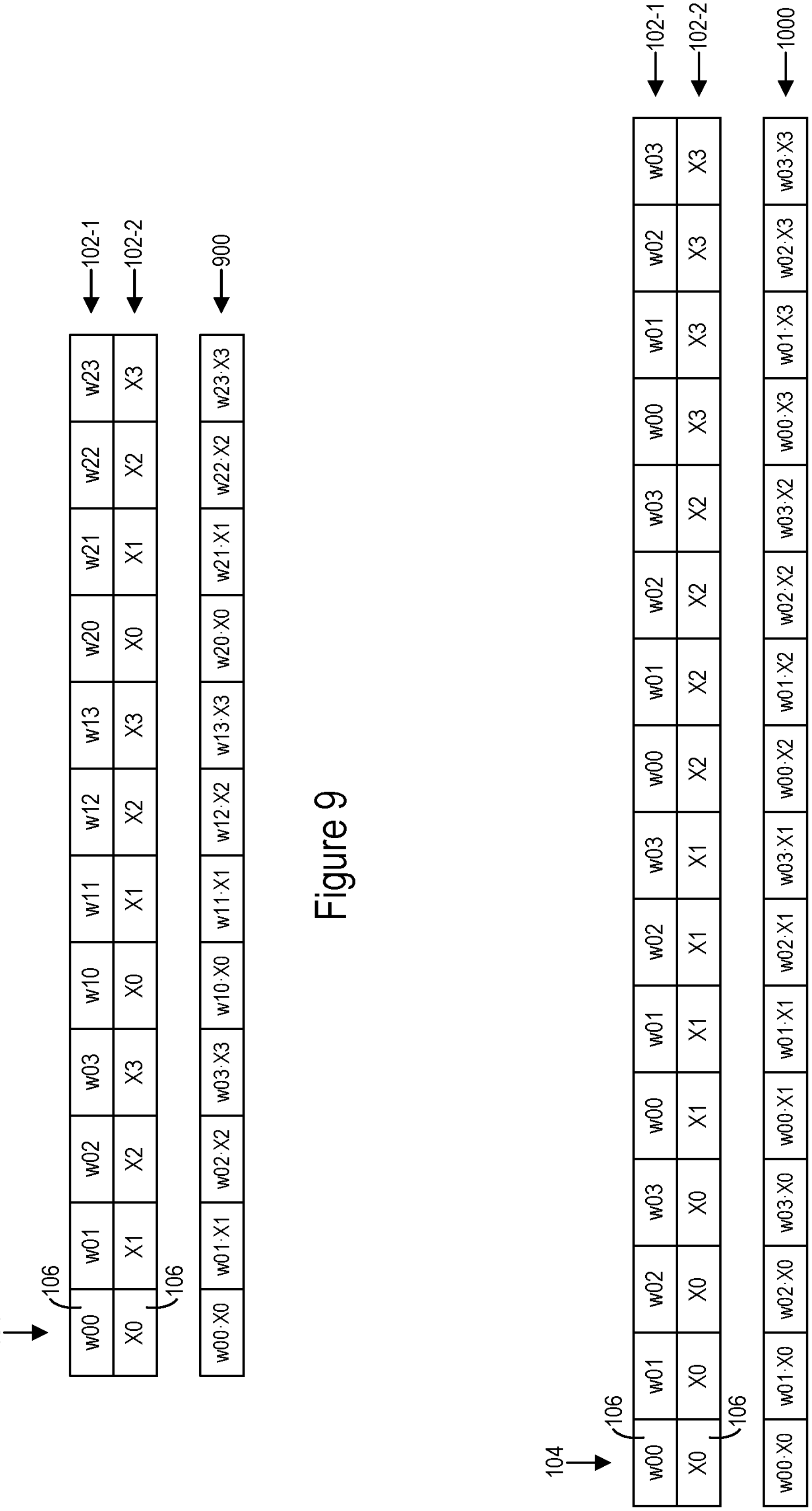
FIG. 9 is a table illustrating a bitwise AND calculation performed as part of matrix multiplication, in accordance with some embodiments.
FIG. 10 is a table illustrating a bitwise AND calculation performed as partial-product computation for multipliers, in accordance with some embodiments.

For example, elements of a matrix are stored in the first row of the first pair of rows, repeated instances of a vector are stored in the second row of the first pair of rows, and the computation is multiplication of the matrix and the vector. FIG. 9 shows elements w00 through w23 of a matrix W stored in respective memory cells 106 of a first row 102-1 and repeated instances of elements X0 through X3 of a vector X stored in respective memory cells 106 of a second row 102-2. The matrix W may be a matrix of weights for a neural network and the vector X may be an activation vector for the neural network. (While the matrix W is shown as a 4×4 matrix and the vector X is shown as four dimensional, other sizes are possible.) Respective elements of the matrix W and the vector X in the same rows 104 are ANDed: respective NAND gates 302 (FIGS. 3-4) operate on respective elements of the matrix W and the vector X in the same columns 104, and respective detectors 308 (FIGS. 3-4) invert the results of the NAND operations, producing results 900. The results 900 may be provided (e.g., as output signals LF_out1 132 or LF_out2 134, FIG. 1) on respective outputs 312. The results 900 provide terms for the matrix multiplication of the matrix W and the vector X, thus accelerating the multiplication.

FIG. 10 illustrates another example of a bitwise AND calculation, performed as partial-product computation for multipliers, in accordance with some embodiments. Repeated instances of respective elements of the matrix W (e.g., elements w00, w01, w02, w03, etc.) are stored in the first row 102-1. Repeated instances of elements X0 through X3 of the vector X are stored in the second row 102-2, as shown. Each instance of a respective element of the matrix W is stored in the same column 104 as a distinct element of the vector X. The resulting bitwise AND calculation produces results 1000, thereby computing partial-product terms. The results 1000 may be provided (e.g., as output signals LF_out1 132 or LF_out2 134, FIG. 1) on respective outputs 312. This calculation may be combined with an XOR function (e.g., implemented as described below) to pre-compute generate and propagate terms for a carry-lookahead adder (CLA).

In some embodiments of the method 800, the computation is a bitwise OR calculation for first data and second data. For example, the first data are stored in the first row of a pair of rows and the second data are stored in the second row of the pair of rows. The first and second rows of the pair of rows are selected. The respective logic gates that provide the results include NOR gates (e.g., NOR gates 502, FIGS. 5-6).

In another example of a bitwise OR calculation, the first data are stored in a row of a first pair of rows and the second data are stored in a row of a second pair of rows. The row in which the first data are stored and the row in which the second data are stored are selected. The respective logic gates that provide the results include NOR gates (e.g., NOR gates 502, FIGS. 5-6). The selecting enables respective portions of the NOR gates that are coupled to respective memory cells in the rows in which the first and second data are stored. For example, the selecting turns on one but not the other of the transistors 504-1 or 504-3 in a first NOR gate 502 and turns on one but not the other of the transistors 504-1 or 504-3 in a second NOR gate 502. Because the NOR gates 502 for a column 504 are connected in parallel to the same sense line 126 (i.e., in a wired-OR configuration), multiple NOR gates 502 or portions thereof may be enabled to perform NOR operations for data in rows 102 situated in multiple pairs of rows. The enabled multiple NOR gates 502 or portions thereof effectively form a single NOR gate.

Figure 11:
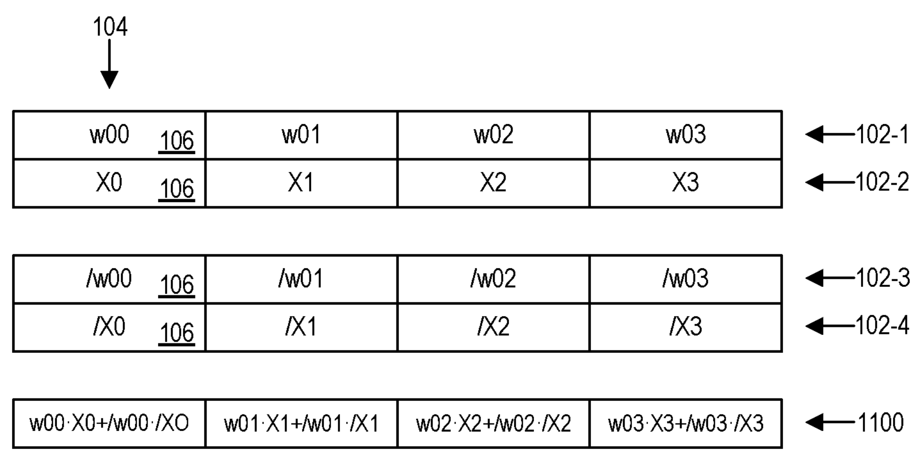
FIG. 11 is a table illustrating a bitwise XOR calculation in accordance with some embodiments.

In some embodiments of the method 800, first data are stored in one row of a first pair of rows, second data are stored in another row of the first pair of rows, the complement of the first data are stored in one row of a second pair of rows, and the complement of the second data are stored in another row of the second pair of rows. The first pair of rows and the second pair of rows are selected. The respective logic gates that provide the results include NAND gates (e.g., NAND gates 302, FIGS. 3-4). The computation is a bitwise exclusive-OR (XOR) calculation for the first data and the second data, in accordance with the formula that XOR may be calculated by AND'ing A and B, AND'ing /A and /B (i.e., the complements of A and B), and OR'ing the results:

$$A\ XOR\ B = A \cdot B + /A \cdot /B \quad (1)$$

where /A and /B (which may also be written as ~A and ~B) are the complements of A and B respectively, "•" is the symbol for AND, and "+" is the symbol for OR. FIG. 11 illustrates an example of such an XOR calculation for a matrix W and vector X. Elements of the matrix W are stored in respective memory cells 106 of a first row 102-1 of a first pair of rows. Elements of the vector X are stored in respective memory cells 106 of a second row 102-2 of the first pair of rows. Elements of the complement of the matrix W are stored in respective memory cells 106 of a first row 102-3 of a second pair of rows. Elements of the complement of the vector X are stored in respective memory cells 106 of a second row 102-4 of the second pair of rows. The results 1100 may be provided (e.g., as output signals LF_out1 132 or LF_out2 134, FIG. 1) on respective outputs 312.

In some embodiments of the method 800, the computation is a bitwise inverse-OR calculation for the first data and the second data. For example, the complement of first data are stored in the first row of a pair of rows and the complement of second data are stored in the second row of the pair of rows. The first and second rows of the pair of rows are selected. The respective logic gates that provide the results include NOR gates (e.g., NOR gates 502, FIGS. 5-6).

In another example of a bitwise inverse-OR calculation, the complement of first data are stored in a row of a first pair of rows and the complement of second data are stored in a row of a second pair of rows. The row in which the complement of the first data are stored and the row in which the complement of the second data are stored are selected. The respective logic gates that provide the results include NOR gates (e.g., NOR gates 502, FIGS. 5-6). The selecting enables respective portions of the NOR gates that are coupled to respective memory cells in the rows in which the complements of the first and second data are stored. The enabled portions of the NOR gates in a particular column are in parallel with each other (i.e., in a wired-OR configuration) because they are connected to the same sense line (e.g., sense line 126). The enabled portions of the NOR gates in the particular column thus effectively form a single NOR gate, which is used for the bitwise inverse-OR calculation.

In some embodiments, the pair of rows includes a first pair of rows. The pluralities of logic gates include a first plurality of logic gates that corresponds to (e.g., is embedded in) the first pair of rows. The output of each logic gate of the first plurality of logic gates is coupled to a sense line (e.g., a sense line 702, FIG. 7) extending in the direction of the first pair of rows. The results (e.g., as provided on output signals 706, FIG. 7) are obtained (814) from the sense line (e.g., are obtained by detector circuitry 704, FIG. 7).

The method 800 may allow a corresponding memory (e.g., with an array 100, FIG. 1, or 700, FIG. 7) to be reconfigured to perform different logic functions by appropriately storing data and selecting logic gates (e.g., logic gates 108 and/or 110). The method 800 also reduces both read time and compute time, and thereby accelerates computations. For example, the method 800 may accelerate GEMM operations for a neural network.

The purpose of a function selector (e.g., function selector 112, selection logic 1212, selection logic 1312, selection logic 1412) is to enable computation in a memory array. Generally, the number of function selector lines would match the number of Rows of compute elements. However, this is not a strict requirement. Some embodiments can have fewer (e.g., half) as many selector lines as the number of rows. In a SoC implementation, there are several ways to generate these signals including a 1D vector array (e.g., Register array), a 2D associative array (e.g., using TCAM), or a 2D association to an independent memory (e.g., SRAM, Register File, MRAM, any resistive memory).

Figure 12:
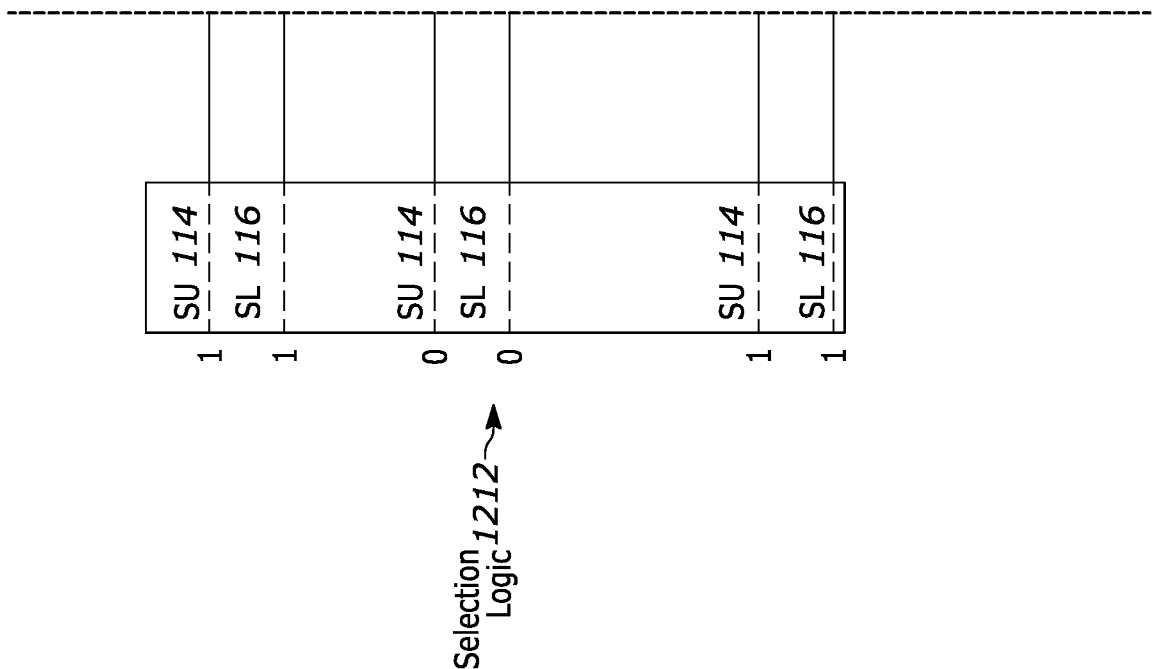
FIG. 12 is a schematic view of a semiconductor memory 1200 having a 1D vector array selector in accordance with some embodiments.
Figure 12:
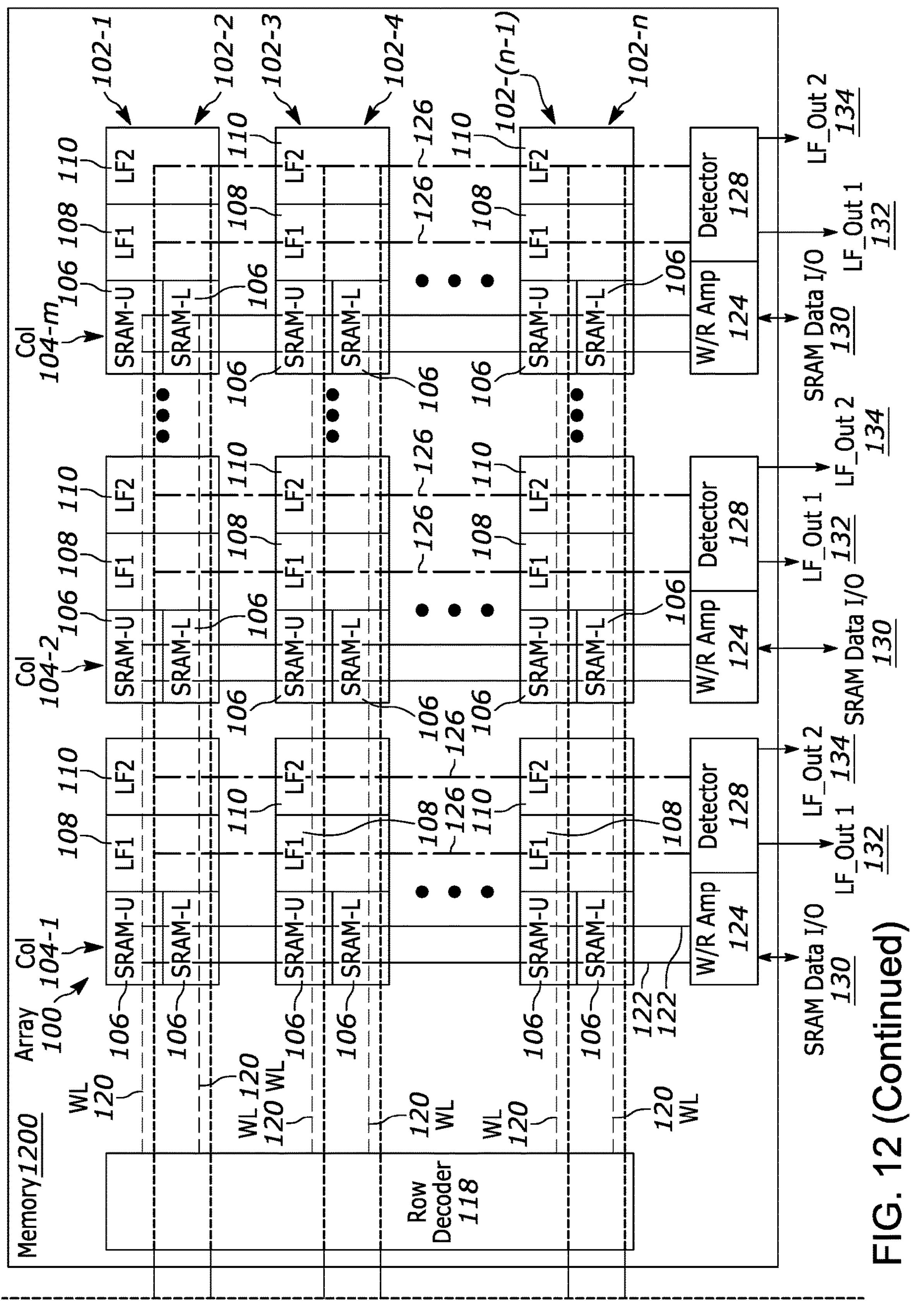

FIG. 12 is a schematic view of a semiconductor memory 1200 having a 1D vector array selector in accordance with some embodiments. The memory 1200 includes array 100 as previously described. The array 100 includes rows 102-1 through **102-*n* and columns 104-1 through 104-*m* of memory cells 106, where integers n and m are the respective numbers of rows and columns. In some embodiments, the memory cells 106 are static random-access memory (SRAM cells), as shown in FIG. 12. Each memory cell 106 is connected to a wordline (WL) 120 and a pair of bitlines 122. The memory cells 106 in each row 102 are connected to a respective wordline 120, while the memory cells 106 in each column 104 are connected to a respective pair of bitlines 122. A row decoder 118 activates the memory cells 106 in a selected row 102 by asserting a signal on the wordline 120 of the selected row 102 (e.g., by biasing the wordline 120 of the selected row 102 to a logic-high state). Asserting the signal on the wordline 120 causes the memory cells 106 in the selected row 102 to become conductively coupled to their respective pairs of bitlines 122. When the signal on a wordline 120 is de-asserted (e.g., the wordline 120 is biased to a logic-low state), the memory cells 106 in the corresponding row 102 are not conductively coupled to their respective pairs of bitlines 122. The wordlines 120 may be one-hot, such that the row decoder 118 only asserts a signal on a single wordline 120 at a given time for a given operation (e.g., for a read or write operation). For write operations, SRAM data input/outputs (I/Os) 130 provide data to write/read (W/R) amplifiers 124, which drive the data onto the pairs of bitlines 122. The data itself are driven onto a first bitline of each pair of bitlines 122 and the complement data ("data-bar") are driven onto a second bitline 122 of each pair of bitlines 122. The data are written into the memory cells 106 of the selected row 102. For read operations, the memory cells 106 in the selected row 102 drive their respective pairs of bitlines 122. The signals on the pairs of bitlines 122 are amplified by the W/R amplifiers 124 and provided to the SRAM data I/Os 130** as output.

The array 100 also includes logic gates (i.e., compute elements) 108 and/or 110. The logic gates 108 and/or 110 implement logic functions using data from respective memory cells 106. For example, each logic gate 108 implements a first logic function (LF1) using data from a respective pair of memory cells 106 in a respective pair of rows 102, and each logic gate 110 implements a second logic function (LF2) using the data from the respective pair of memory cells 106 in the respective pair of rows 102. The respective pair of memory cells 106 may be situated in the same column 104. For example, the respective pair of memory cells 106 may include an upper SRAM cell (SRAM-U) and a lower SRAM cell (SRAM-L). Each logic gate 108 may be adjacent to a respective logic gate 110. In some embodiments, the logic gates 110 are omitted, such that the array only includes logic gates 108 that implement a first logic function. In some other embodiments, the array 100 includes additional logic gates that implement additional logic functions beyond the first and second logic functions (e.g., a third logic function, third and fourth logic functions, etc.) using the data from the respective pair of memory cells 106 in the respective pair of rows 102.

Each pair of rows 102 (e.g., rows 102-1 and 102-2, rows 102-3 and 102-4, etc.) includes a first row (e.g., an upper row, such as row 102-1, row 102-3, etc., or alternatively a lower row) and a second row (e.g., a lower row, such as row 102-2, row 102-4, etc., or alternatively an upper row). In some embodiments, the first and second rows in a respective pair of rows 102 (e.g., in each pair of rows 102) are adjacent to each other in the array 100 (i.e., the first row is adjacent to the second row). In some embodiments, a respective plurality of logic gates 108 and/or 110 is embedded in a respective pair of rows (i.e., is embedded in the first and second rows of the respective pair of rows 102) in the array 110. For example, a respective plurality of logic gates 108 and/or 110 may be embedded in each respective pair of rows 102 in the array 100. Logic gates 108 and/or 110 of the respective plurality of logic gates may be embedded in the first and second rows between successive memory cells 106 along the first and second rows. In the example of FIG. 12, a logic gate 108 and a logic gate 110 are embedded between successive memory cells 106 in the first and second rows of each pair of rows 102. Each logic gate 108 in a pair of rows 102 is adjacent to preceding memory cells 106 in the first and second rows of the pair of rows 102. Each logic gate 110 in a pair of rows 102 is adjacent to subsequent memory cells 106 in the first and second rows of the pair of rows 102 (except for the last logic gate 110 in each pair of rows 102).

Each logic gate 108 and/or 110 has a first input coupled to a respective memory cell 106 in the first row of a pair of rows 102 and a second input coupled to a respective memory cell 106 in the second row of the pair of rows 102. Again, the respective memory cells 106 may be situated in the same column 104. In some embodiments, respective logic gates 108 and/or 110 are adjacent to respective memory cells 106 in the first row to which first inputs of the respective logic gates 108 and/or 110 are coupled, and/or are adjacent to respective memory cells 106 in the second row to which second inputs of the respective logic gates 108 and/or 110 are coupled. For example, each adjacent pair of logic gates 108 and 110 embedded in a pair of rows 102 have first inputs coupled to a single adjacent (e.g., preceding or following) memory cell 106 in the first row and second inputs coupled to a single adjacent (e.g., preceding or following) memory cell 106 in the second row. In some embodiments, three or more logic gates, each of which may implement a separate logic function, are embedded between successive memory cells 106 in each pair of rows 102, with inputs coupled to a single respective (e.g., adjacent, such as preceding or following) memory cell 106 in the first row and to a single respective (e.g., adjacent, such as preceding or following) memory cell 106 in the second row.

The array 1200 further includes function selection logic 1212 that includes a one dimensional (1D) array to generate one or more select lines 1214 and/or 1216 (e.g., a plurality of select lines 1214 and 1216) associated with each pair of rows 102, to provide enable signals to corresponding logic gates 108 and/or 110 (e.g., to the logic gates 108 and/or 110 embedded in the pair of rows 102). In one example, the 1D vector array is a register that can be loaded with logic high or logic low states (e.g., 1's or 0's) to control compute operations of the array 1200.

The select lines 1214 and/or 1216 extend in the direction of the rows 102. Each logic gate 108 and/or 110 includes one or more enable inputs (e.g., a plurality of enable inputs) coupled to one or more respective select lines 1214 and/or 1216. In some embodiments, the array 1200 includes an upper select line (SU) 1214 and a lower select line (SL) 1216 for each pair of rows 102, to provide enable signals to the logic gates 108 and/or 110 embedded in the pair of rows 102. The upper select line 1214 for a pair of rows 102 provides a first enable signal and the lower select line 1216 for the pair of rows 102 provides a second enable signal. The upper select line 1214 may extend along a first row of the pair of rows 102 and the lower select line 116 may extend along a second row of the pair of rows 102. Asserting enable signals on the one or more select lines 1214 and/or 1216 coupled to inputs of respective logic gates 108 and/or 110 (e.g., biasing the one or more select lines 1214 and/or 1216 to logic-high states) activates the respective logic gates 108 and/or 110, causing the logic gates 108 and/or 110 to implement their logic functions using data from respective memory cells 106 to which inputs of the logic gates 108 and/or 110 are coupled. De-asserting enable signals on the one or more select lines 114 and/or 116 coupled to inputs of respective logic gates 108 and/or 110 (e.g., biasing the one or more select lines 1214 and/or 1216 to logic-low states) de-activates the respective logic gates 108 and/or 110, thereby stopping the logic gates 108 and/or 110 from implementing their logic functions.

The detector circuitry 128 provides the results of the first logic function implemented by the logic gates 108 as output signals LF_out1 132 and provides the results of the second logic function implemented by the logic gates 110 as output signals LF_out2 134.

Figure 13:
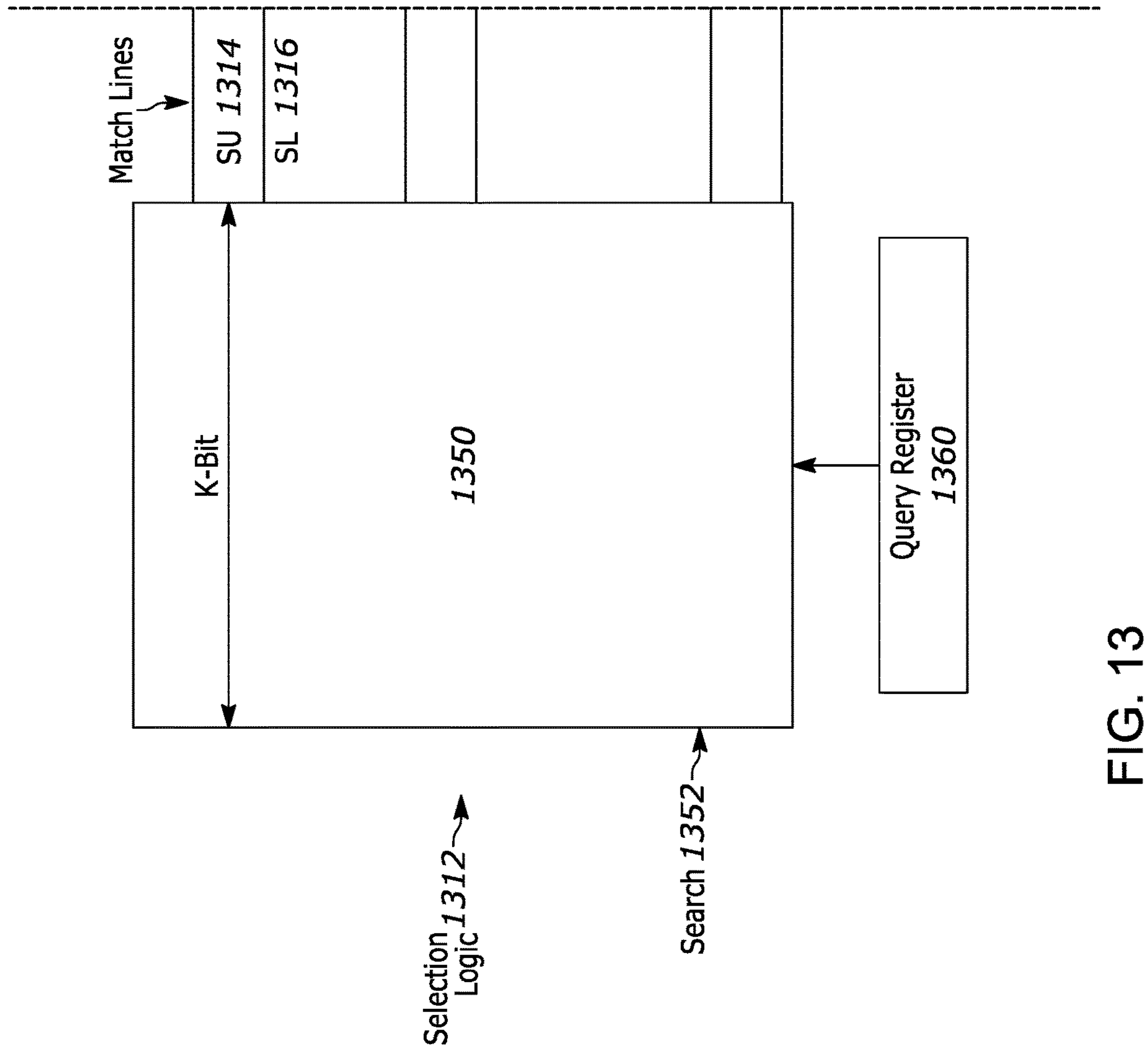
FIG. 13 is a schematic view of semiconductor memory 1300 with a selection logic having a 2D associative array to function as a function selector in accordance with some embodiments.
Figure 13:
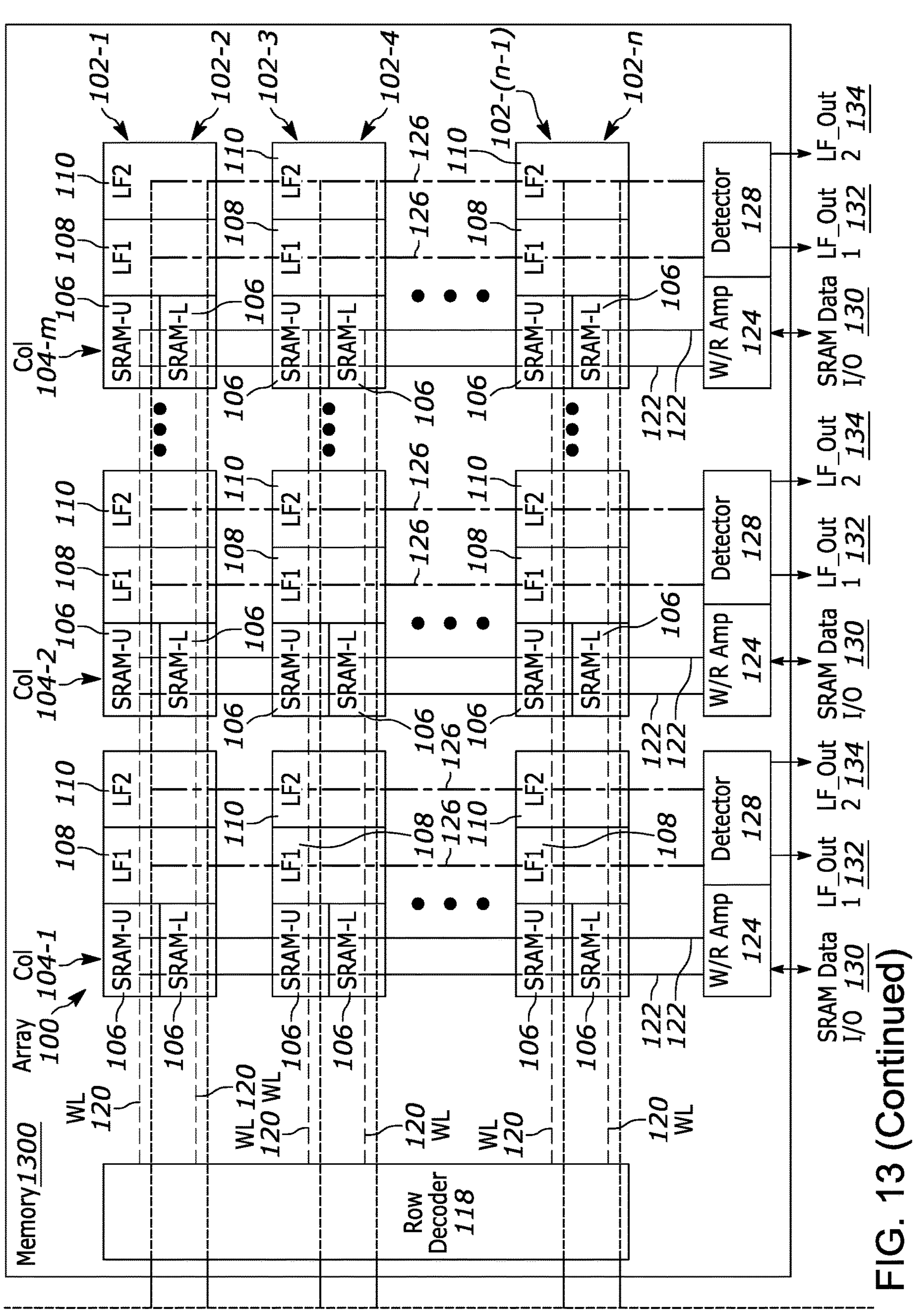

FIG. 13 is a schematic view of semiconductor memory 1300 with a selection logic having a 2D associative array to function as a function selector in accordance with some embodiments. The memory 1300 includes similar circuitry and logic as memory 1200 except that the function selection logic 1212 has been replaced with a function selection logic 1312 that includes a k-bit content addressable memory (CAM) 1350 and a query register 1360. The CAM memory 1350 holds k-bit metadata that generates select lines 1314 and 1316 to cause an activation of compute elements (e.g., logic gates) of the compute array 100. CAM is a special type of computer memory used in very high speed searching applications. In one example, the CAM is a ternary CAM that searches its entire contents in a single clock cycle. The ternary CAM (TCAM) can store and query data using three different inputs: 0, 1, and X.

A search input 1352 initiates a compare operation of the k-bit query register 1360 against the contents of the CAM memory of the selection logic 1312. Any matching rows corresponding to the search are driven to a second logic state (e.g., '1'); the mismatching rows remain in a first logic state (e.g., '0') for the CAM memory. This method provides the flexibility to associate metadata to the compute elements (e.g., logic function 108, 110).

In a simplest form, the metadata can correspond to a row-index of the CAM memory of the selection logic 1312. In one example, the CAM array density corresponds to the # of SU's and SL's (e.g., function selections 1314, 1316). The CAM width is independent of the density of the compute array block. The computation profile can be easily changed by reprogramming the CAM memory with different metadata using an application programming interface (API) or higher level software. The CAM provides two degrees of freedom for controlling compute operations of the compute array block.

Figure 14:
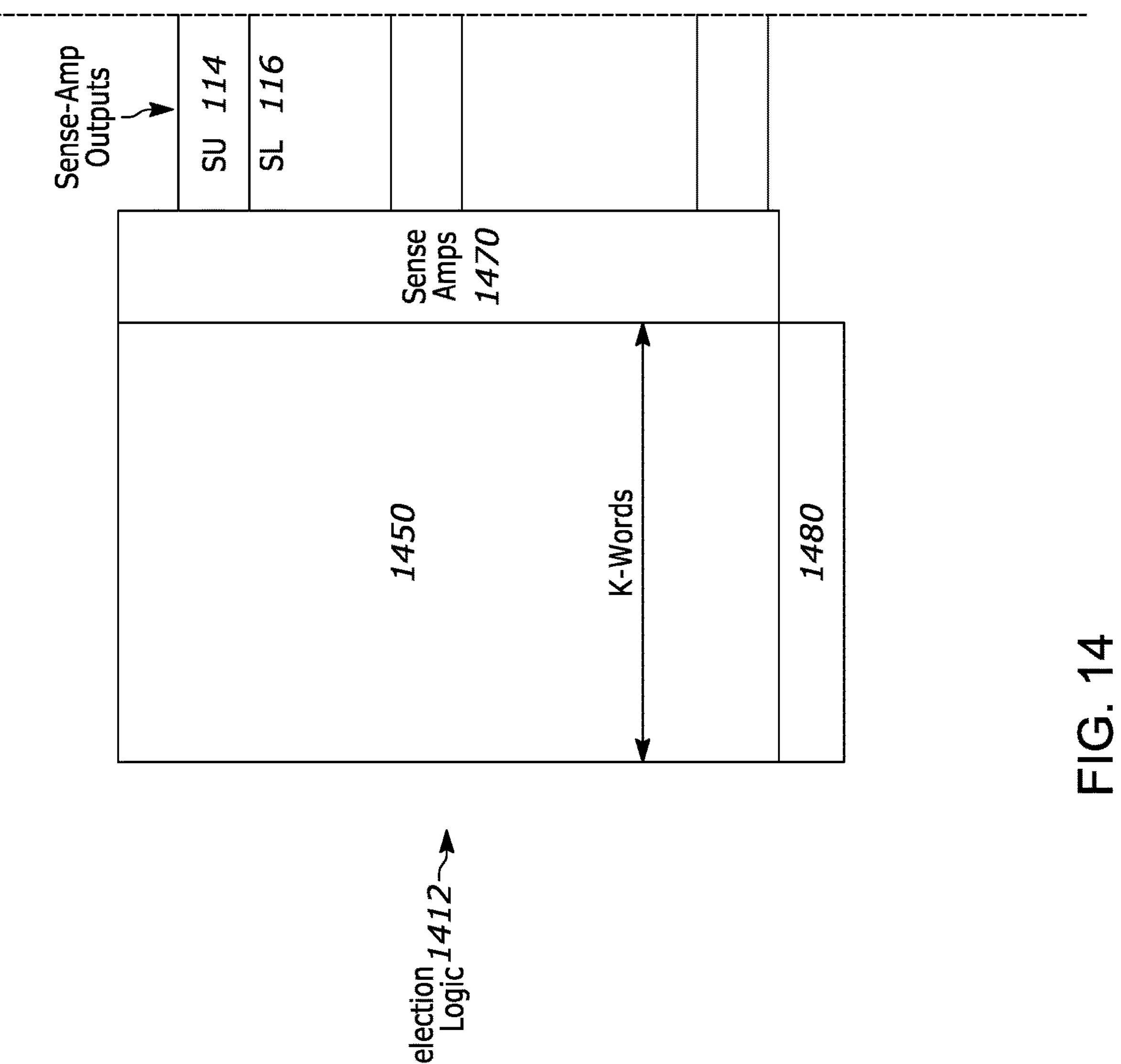
FIG. 14 is a schematic view of an array 1400 with a 2D association for function selection logic in a semiconductor memory in accordance with some embodiments.
Figure 14:
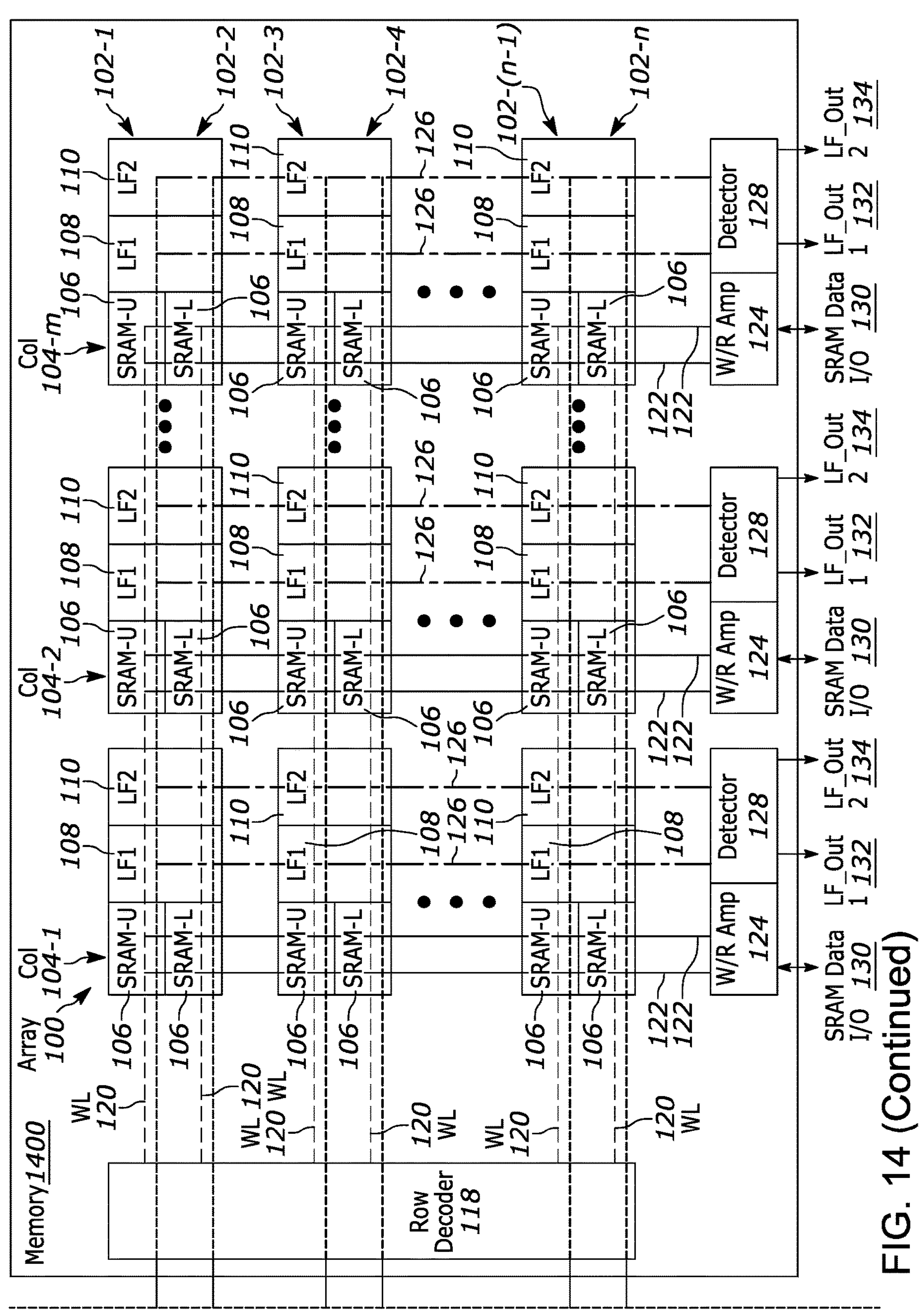

FIG. 14 is a schematic view of an array 1400 with a 2D association for function selection logic in a semiconductor memory in accordance with some embodiments. The array 1400 includes similar circuitry and logic as array 1200 except that the function selection logic 1212 has been replaced with a function selection logic 1412 that includes a memory array 1450 (e.g., SRAM array, MRAM, FeRAM, register file, any resistive memory, any other memory array, a mask ROM with a code stored in the memory array during semiconductor fabrication of the memory array to provide a security feature, etc.) and decoding logic 1480 to decode input of the logic 1412. The memory array 1450 holds metadata. The sense amplifiers 1470 drive the select lines 1414 and 1416 to cause an activation of compute elements of the compute array block. The memory array 1450 can be SRAM, magnetic RAM (MRAM), FeRAM, any resistive RAM, or any other type of memory.

As in FIG. 13, the bit width of the memory (# of IO's) corresponds to the number of select lines 1414 and 1416.

The storage density of the memory array is independent of the Compute array block. The computation profile can be easily changed by reprogramming the memory array 1450 with different metadata using an application programming interface (API) or higher level software. The memory array 1450 provides two degrees of freedom for controlling compute operations of the compute array block. Metadata makes finding and working with data easier, thus allowing the user to sort or locate specific documents. Some examples of basic metadata are author, date created, date modified, and file size. Metadata can be descriptive, administrative, or structural. The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A memory, comprising:

a compute array to perform compute operations comprising rows and columns of memory cells, the rows comprising a first pair of rows of memory cells, the first pair comprising a first row of memory cells and a second row of memory cells;

a plurality of logic gates embedded in the first pair of rows of memory cells, each comprising a first input coupled to a respective memory cell in the first row, a second input coupled to a respective memory cell in the second row, and an output, wherein respective logic gates of the plurality of logic gates are embedded in the first pair of rows between successive memory cells along the first and second rows, wherein at least one logic gate of the plurality of logic gates is configured to function as a first type of compute element to apply a first logic function to data values of respective memory cells of the first pair of rows of memory cells; and selection logic coupled to the plurality of logic gates, wherein the selection logic includes a two dimensional (2D) associative array to generate select lines associated with the first pair of rows of memory cells, the select lines are configured to provide enable signals to the plurality of logic gates to control compute operations including one or more of addition or multiply operations of the compute array.

2. The memory of claim 1, wherein the two dimensional (2D) associative array comprises a k-bit content addressable memory (CAM), wherein at least one logic gate of the plurality of logic gates is configured to function as a second type of compute element to apply a second logic function to the data values of the respective memory cells of the first pair of rows of memory cells.

3. The memory of claim 2, wherein the k-bit CAM memory holds k-bit metadata used to generate the select line and to cause an activation of the plurality of logic gates of the compute array to perform parallel general matrix multiplication (GEMM) operations.

4. The memory of claim 1, wherein the selection logic is configured to receive a search input to initiate a compare operation of a k-bit query register against contents of the k-bit CAM memory of the selection logic, to determine any matching rows corresponding to the search and to drive to a second logic state, and to determine any mismatching rows which remain a first logic state for the CAM memory.

5. The memory of claim 3, wherein the metadata corresponds to a row-index of the k-bit CAM memory.

6. The memory of claim 5, wherein an array density of the k-bit CAM memory corresponds to a number of upper select lines and lower select lines.

7. The memory of claim 5, wherein a width of the k-bit CAM memory is independent of a density of the compute array block.

8. The memory of claim 5, wherein a computation profile is adjustable by reprogramming the k-bit CAM memory with different metadata.

9. The memory of claim 1, wherein a first input of each logic gate is connected to an internal node within the respective memory cell in the first row, without an intervening transistor; and a second input of each logic gate is connected to an internal node within the respective memory cell in the second row, without an intervening transistor, wherein each logic gate of the plurality of logic gates further comprises one or more enable inputs coupled to the one or more select lines.

10. The memory of claim 1, wherein the memory cells including the memory cells of the first and second rows, are static random-access memory (SRAM) cells having internal data and data-bar nodes;

the first input of each logic gate is connected to the internal data node or data-bar node of the respective memory cell in the first row; and the second input of each logic gate is connected to the internal data node or data-bar node of the respective memory cell in the second row.

11. A memory, comprising:

a compute array comprising rows and columns of memory cells, the rows comprising a first pair of rows of memory cells, the first pair comprising a first row of memory cells and a second row of memory cells;

a plurality of logic gates embedded in the first pair of rows of memory cells, each comprising a first input coupled to a respective memory cell in the first row, a second input coupled to a respective memory cell in the second row, and an output, wherein respective logic gates of the plurality of logic gates are embedded in the first pair of rows between successive memory cells along the first and second rows, wherein at least one logic gate of the plurality of logic gates is configured to function as a first type of compute element to apply a first logic function to data values of respective memory cells of the first pair of rows of memory cells;

selection logic coupled to the plurality of logic gates, wherein the selection logic includes a two dimensional (2D) memory array to generate select lines associated with the first pair of rows of memory cells; and sense amplifiers to drive the select lines to cause an activation of the plurality of logic gates to control compute operations including one or more of addition or multiply operations of the compute array.

12. The memory of claim 11, wherein the 2D memory array comprises static random-access memory (SRAM), magnetic random-access memory (MRAM), or FeRAM.

13. The memory of claim 11, wherein the 2D memory array comprises any type of resistive RAM.

14. The memory of claim 11, wherein the 2D memory array holds k-bit metadata used to generate the select lines and to cause an activation of the plurality of logic gates of the compute array to perform parallel general matrix multiplication (GEMM) operations.

15. The memory of claim 11, wherein an array density of the 2D memory array corresponds to a number of upper select lines and lower select lines, wherein at least one logic gate of the plurality of logic gates is configured to function as a second type of compute element to apply a second logic function to the data values of the respective memory cells of the first pair of rows of memory cells.

16. The memory of claim 11, wherein a width of the 2D memory array is independent of a density of the compute array block.

17. The memory of claim 11, wherein a computation profile is adjustable by reprogramming the 2D memory array with different metadata.

18. The memory of claim 11, wherein a first input of each logic gate is connected to an internal node within the respective memory cell in the first row, without an intervening transistor; and a second input of each logic gate is connected to an internal node within the respective memory cell in the second row, without an intervening transistor, wherein each logic gate of the plurality of logic gates further comprises one or more enable inputs coupled to the one or more select lines.

19. The memory of claim 11, wherein the memory cells including the memory cells of the first and second rows, are static random-access memory (SRAM) cells having internal data and data-bar nodes;

the first input of each logic gate is connected to the internal data node or data-bar node of the respective memory cell in the first row; and the second input of each logic gate is connected to the internal data node or data-bar node of the respective memory cell in the second row.

* * * * *